(12) United States Patent
Kidambi

(10) Patent No.: US 7,839,323 B2
(45) Date of Patent: Nov. 23, 2010

(54) ERROR ESTIMATION AND CORRECTION IN A TWO-CHANNEL TIME-INTERLEAVED ANALOG-TO-DIGITAL CONVERTER

(75) Inventor: Sunder S. Kidambi, Austin, TX (US)

(73) Assignee: Intersil Americas, Inc., Milpitas, CA (US)

( * ) Notice: Subject to any disclaimer, the term of this patent is extended or adjusted under 35 U.S.C. 154(b) by 45 days.

(21) Appl. No.: 12/419,599

(22) Filed: Apr. 7, 2009

(65) Prior Publication Data

US 2010/0164763 A1     Jul. 1, 2010

Related U.S. Application Data

(60) Provisional application No. 61/141,086, filed on Dec. 29, 2008.

(51) Int. Cl.
*H03M 1/06* (2006.01)
(52) U.S. Cl. .................................. 342/118; 375/232
(58) Field of Classification Search ......... 341/118–155; 375/232, 316, 350
See application file for complete search history.

(56) References Cited

U.S. PATENT DOCUMENTS

| | | | |
|---|---|---|---|
| 7,336,729 B2* | 2/2008 | Agazzi | 375/316 |
| 7,501,967 B2* | 3/2009 | Draxelmayr et al. | 341/141 |
| 7,551,114 B2* | 6/2009 | Joy et al. | 341/161 |
| 7,693,214 B2* | 4/2010 | Shida | 375/232 |

FOREIGN PATENT DOCUMENTS

WO     WO 2006/083199 A1     8/2006

OTHER PUBLICATIONS

M. Seo, M. J. W. Rodwell and U. Madhow, "A low computation adaptive technique for blind correction of mismatch errors in multichannel time-interleaved ADCs", IEEE international Midwest Symposium on Circuits and Systems, pp. 292-296, Sep. 2006 (Day not available).

(Continued)

*Primary Examiner*—Lam T Mai
(74) *Attorney, Agent, or Firm*—Hamilton, Brook, Smith & Reynolds, P.C.

(57) ABSTRACT

A two-channel time-interleaved analog-to-digital converter (TIADC) system that provides for estimation and correction of offset, gain, and sample-time errors. Error in the offsets of the two ADCs that form the TIADC produces a spurious signal at the Nyquist frequency that can be used to minimize the difference of offsets of the ADCs. The difference in gain between the two ADCs produces spurious signals reflected around the Nyquist frequency whose magnitudes can be reduced by minimizing the difference in signal power between the two ADCs. An Automatic Gain Control loop corrects the scaling of the input signal due to the average of the gains of the ADCs. Phase error produces spurious signals reflected around the Nyquist frequency that are $\pi/2$ out of phase with those due to the gain error. Minimizing the difference between the correlation of consecutive signals from the ADCs reduces the magnitude of these image tones.

33 Claims, 21 Drawing Sheets

OTHER PUBLICATIONS

M. Seo and M. Rodwell, "Generalized Blind Mismatch Correction for a two-channel Time-interleaved ADC: Analytic Approach", IEEE Transactions on Circuits and Systems, 2007, pp. 109-112, May 27-30, 2007.

J. Elbornsson, F. Gustaffson and J. E. Eklund, "Blind Adaptive Equalization of Mismatch Errors in a time-interleaved A/D Converter System", IEEE Transactions on Circuits and Systems-1:, vol. 51, No. 1, pp. 151-158, Jan. 2004 (Day not available).

J. Elbornsson, F. Gustaffson and J. E. Eklund, "Blind Equalization of Time Errors in a Time-Interleaved ADC System", IEEE Transactions on Signal Processing, vol. 53, No. 4, pp. 1413-1424, Apr. 2005 (Day not available).

D. Camarero, Jean-Francois Naviner and P. Loumeau, "Digital background and blind calibration for clock skew error in time-interleaved analog-go-digital converters", SBCCI, Pernambuco, Brazil, pp. 228-232, Sep. 7-11, 2004.

B. P. Ginsburg and A. P. Chandrakasan, "Dual Scalable 500MS/s, 5b Time-Interleaved SAR ADCs for UWB Applications", Department of Electrical Engineering and Computer Science, Massachusetts Institute of Technology, Cambridge, MA 02139, USA (Date not available).

M. Looney, "Advanced Digital Post-Processing Techniques Enhance Performance in Time-Interleaved ADC Systems", (Date not available).

"Multiply Your Sampling Rate with Time-Interleaved Data Converters", Application Note 989, [online] http://www/maxim-ic.com/an989, Mar. 1, 2001.

\* cited by examiner

ERROR ESTIMATION AND CORRECTION IN A TWO-CHANNEL TIME-INTERLEAVED ANALOG-TO-DIGITAL CONVERTER

RELATED APPLICATIONS

This application claims the benefit of U.S. Provisional Application No. 61/141,086, filed on Dec. 29, 2008. The entire teachings of the above application are incorporated herein by reference.

BACKGROUND OF THE INVENTION

Time-interleaved Analog-to-Digital Converters (TIADC) have received considerable attention in the recent past in applications that require very high sample rates, i.e., sample rates that cannot be provided by a single ADC. In a TIADC system, a fast ADC is obtained by combining slower ADCs operating in parallel. Ideally, the slower ADCs should each have the same offset, the same gain, and the same uniform sample instants. In practice, however, due to fabrication errors, component mismatches, temperature variations, mechanical strain, environmental perturbations, etc., this requirement is difficult to achieve. The resulting errors degrade the performance of the TIADC system significantly, thus making the estimation and correction of these errors imperative to improve performance.

SUMMARY OF THE INVENTION

The present invention is a two-channel TIADC wherein offset, gain, and phase errors are estimated and corrected. For offset estimation and correction, an error expression has been developed wherein it is shown that the average offset value of the two ADCs produces a tone at DC while the difference in the offset between the two ADCs produces a tone at the Nyquist frequency. The algorithm is first used to minimize the tone at Nyquist which depends upon the difference in the offset between the two ADCs. This is achieved by making the offset on one of the ADCs equal to that of the other. The tone at DC, however, can be eliminated in a straightforward manner using well-known DC-offset correction techniques.

For gain error estimation and correction, an expression has been developed wherein it is shown that the difference in gain between the two ADCs produces an image tone reflected around the Nyquist frequency. In addition, the input signal itself is scaled by the average value of the gains of the two ADCs. We develop an algorithm that minimizes the difference in the gain values between the two ADCs. The scaling of the input signal due to the average of the gain values on the two ADCs can be corrected using a separate Automatic Gain Control (AGC) loop.

An expression for the phase error has been developed wherein it is shown that the phase error produces an image tone reflected around the Nyquist frequency. This image tone is $\pi/2$ out of phase with the tone produced due to the gain error. It is also shown that the amplitude of this tone is commensurate with the amount of phase error. The correlation between the outputs of the two ADCs is indicative of the delay between them, and, consequently, an adaptive algorithm is developed that minimizes the difference in the auto-correlation between two adjacent pairs of time samples.

The adaptive algorithms developed for correcting each error treat each error as independent of the other errors in the two-channel TIADC. Embodiments of the present invention comprise adaptive algorithms based on the signs of the respective errors wherein the input signal to the two-channel TIADC is itself the training signal and the estimation and correction of offset, gain, and phase errors are carried out in the background. In other words, the adaptation can be performed using blind adaptive techniques. The entire adaptation is a mixed-signal process wherein the estimation of the various errors are carried out in the digital domain while the correction is carried out in the analog domain. In embodiments, the estimation information in the digital domain is transferred to an appropriate correction in the analog domain by way of a look-up table (LUT). In the offset adaptation loop, for instance, a certain address to the LUT is calculated based on the offset error and the value corresponding to that address in the LUT is used to drive a digital-to-analog converter (DAC) and/or other appropriate analog circuits in the two-channel TIADC to effect the correction. Alternatively, the address of the LUT can be used to drive the DAC and/or analog circuits. Similar mixed-domain operations for gain and phase errors are carried out.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows, beginning with a description of a two-channel time-interleaved analog-to-digital converter (TIADC). Signal processing elements in the TIADC detect and correct (1) offset error, (2) gain error, and (3) sample time error. Mathematical models describing the errors and corresponding detection and correction techniques follow the description of the TIADC.

It should be understood that the signal processing elements described herein may be embodied as discrete analog or digital circuits, as program code executing in a programmable digital processor, a combination of one or more of the same, or in other ways.

Figure 1:
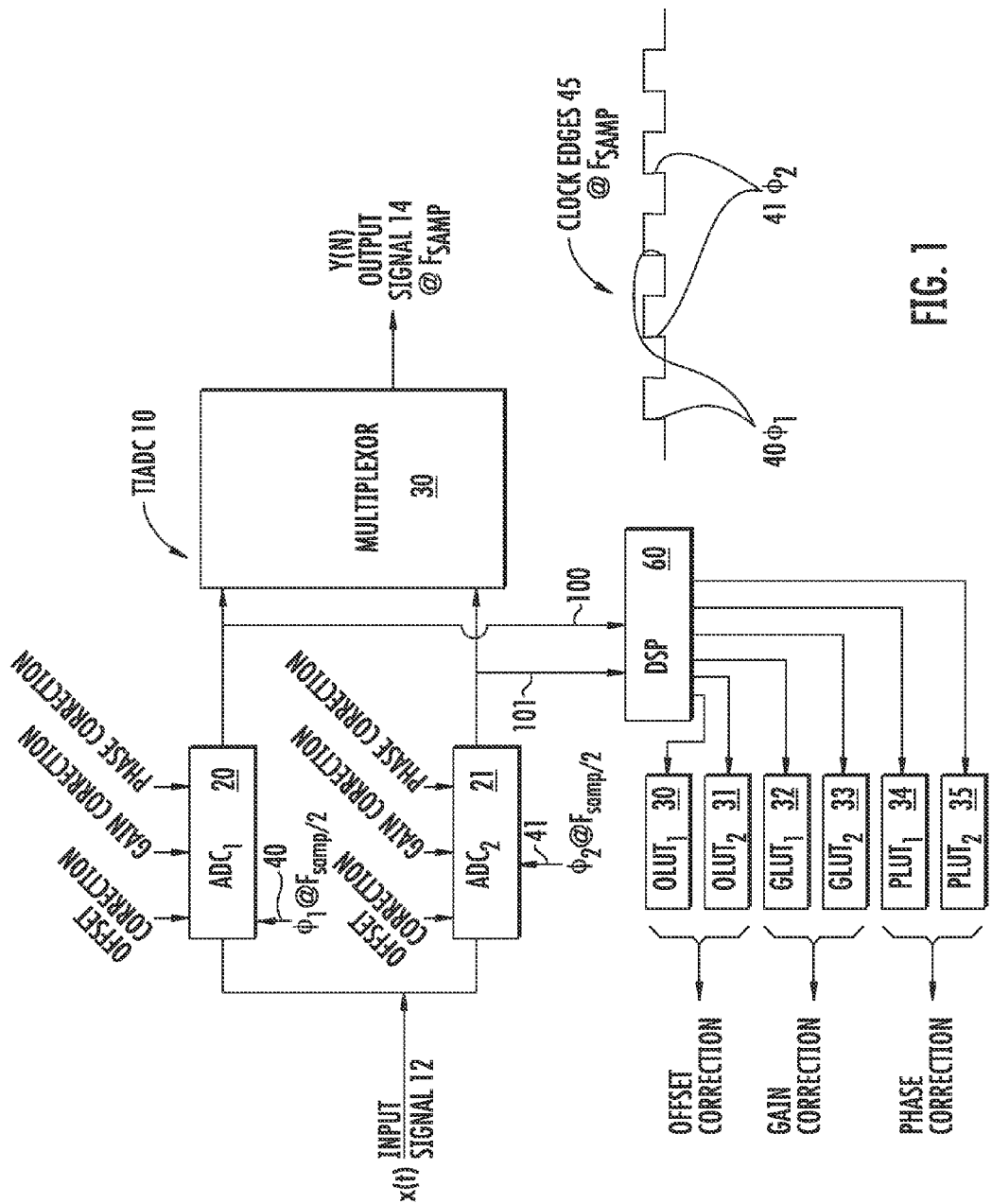
FIG. 1 is a block diagram of a two-channel time-interleaved analog-to-digital converter (TIADC).

FIG. 1 is a block diagram that shows an example two-channel TIADC 10. A typical 2-channel TIADC 10 may have a bit width of 12 bits and operate at sample frequency of 400 Msps. Alternative embodiments may operate at faster or slower sample rates and with larger or smaller bit widths. Two analog-to-digital converters (ADCs) 20 and 21 operate on an analog input signal 12, represented as x(t), to provide a digital output signal 14, represented as y(n). The ADCs 20 and 21 sample and hold the input signal 12 at alternating sample time intervals 2T, where T is the reciprocal of a sample rate, $f_{samp}$, provided by a clock signal 45. In one embodiment, the ADCs 20 and 21 are charge-domain pipeline ADCs that sample and digitize the input signal 12 on odd rising edges 40 and even rising edges 41, respectively, of the clock signal 45. In other embodiments, a phase shifter may be arranged between the clock and the ADCs 20 and 21 to operate the ADCs 20 and 21 in an alternating fashion. A multiplexer 30 interleaves the outputs of the two ADCs 20 and 21, which are at half the sample rate, to produce an output 14 at the sample rate.

A digital signal processor (DSP) 60 monitors and corrects offset, gain, and phase errors in the outputs of the ADCs 20 and 21. Taps 100 and 101 feed the outputs of ADCs 20 and 21, respectively, into the DSP 60, which computes the error and corresponding correction using a bank of look-up tables (LUTs) 30-35 or a bank of digital-to-analog converters (DACs; not shown). In the embodiment shown in FIG. 1, the ADCs 20 and 21 have corresponding offset LUTs (OLUTs) 30 and 31, gain LUTs (GLUTs) 32 and 33, and phase LUTs (PLUTs) 34 and 35. The DSP 60 processes any errors according to adaptive algorithms, examples of which are described below.

In preferred embodiments, the DSP 60 estimates the errors in the digital domain and corrects the errors in the analog domain using values stored in the LUTs 30-35, which typically include a memory. The digital estimation information can be translated into a corresponding analog correction using the LUTs 30-35 as interfaces between the digital and analog domains. For example, analog circuits and/or DACs (not shown) can be used to correct relative and/or absolute offset error between the ADCs 20 and 21 based on a digital error signal and the corresponding address value stored in OLUTs 30 and 31. GLUTs 32 and 33 and PLUTs 34 and 35 can also store address values for digital error signals. In effect, the LUTs 30-35 perform digital-to-analog conversion by converting the error into an analog setting for the ADCs 20 and 21.

Figure 2:
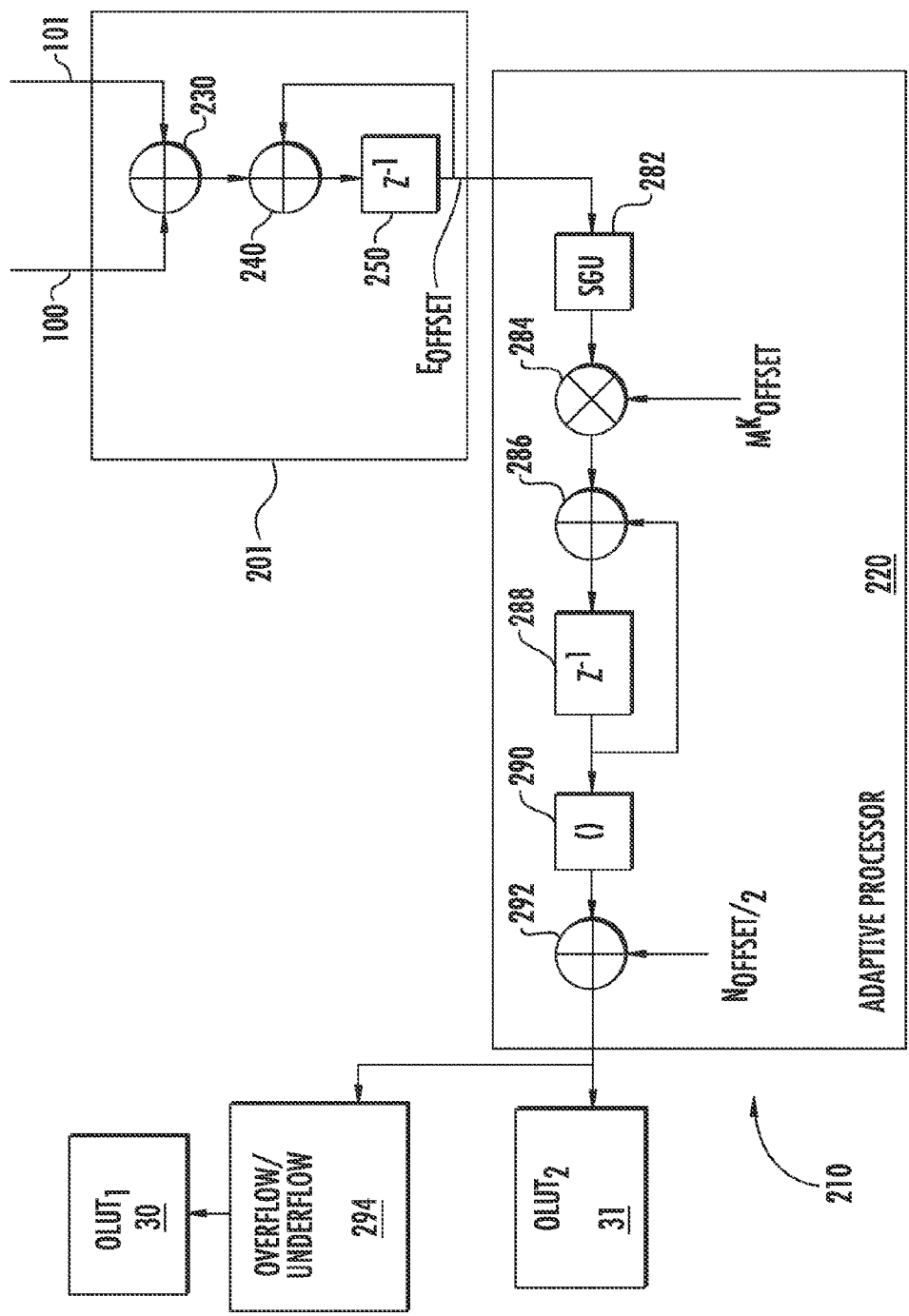
FIG. 2 is a block diagram of an offset correction unit in a two-channel TIADC.

FIG. 2 is a block diagram of an offset correction unit 210, including an error measurement block 201, within the DSP 60. The error measurement block 201 includes a subtractor 230 that takes the difference of the output signals on taps 100 and 101 from the ADCs 20 and 21. An adder 240 coupled to the output of the subtractor 230 forms a feedback loop with a delay register 250; the adder sums the output of the subtractor 230 with a delayed version of the output of the subtractor 230 from the delay register 250, which resets to zero every N samples. The delay register 250 transmits a resulting offset error signal, $e_{offset}$, to an adaptive processor 220. The adaptive processor 220 may be implemented using a DSP, field-programmable gate array, application-specific integrated circuit, programmed general-purpose data processor, or any other suitable implementation. In some embodiments, the adaptive processor 220 operates according to the algorithm described below wherein it selects the address of $OLUT_2$ 31 in a manner that minimizes the offset error signal. The values corresponding to the selected addresses of the OLUTs 30 and 31 are used to correct the offset between the ADCs 20 and 21 in a corresponding manner.

In a preferred embodiment, the adaptive processor 220 determines the sign of the offset error signal using a signum block 282, which returns a −1, 0, or 1 depending on whether the offset error signal is negative, zero, or positive, respectively. Next, the output from the signum block 282 is multiplied with an offset step size $\mu_{offset}^k$ to control the value that adds to a bias $N_{offset}/2$ to the produce the address for $OLUT_2$ 31, as shown in FIG. 2. Depending on the sign of the error signal, the product may result in a forwards step, backwards step, or no change.

The resulting product enters a feedback loop implemented with an adder 286 and a delay register 288. A rounding block 290 rounds the output of the feedback loop to form an address step, which may be biased by a bias value $N_{offset}/2$ using an adder 292. For example, if $OLUT_2$ 31 has 256 address locations that run from 0 to 255, the bias value might be 128, which sets the offset error to the midpoint in the range of $OLUT_2$ 31.

The biased address is then fed to $OLUT_2$ 31 and an overflow/underflow block 294, which monitors the resultant address and, if necessary, resets the address of $OLUT_1$ 30 to keep the address of $OLUT_2$ 31 within an acceptable range. Of course, the bias value and range of address locations depend on the particulars of the implementation. Certain implementations may operate at zero bias, eliminating the adder 292.

Figure 3:
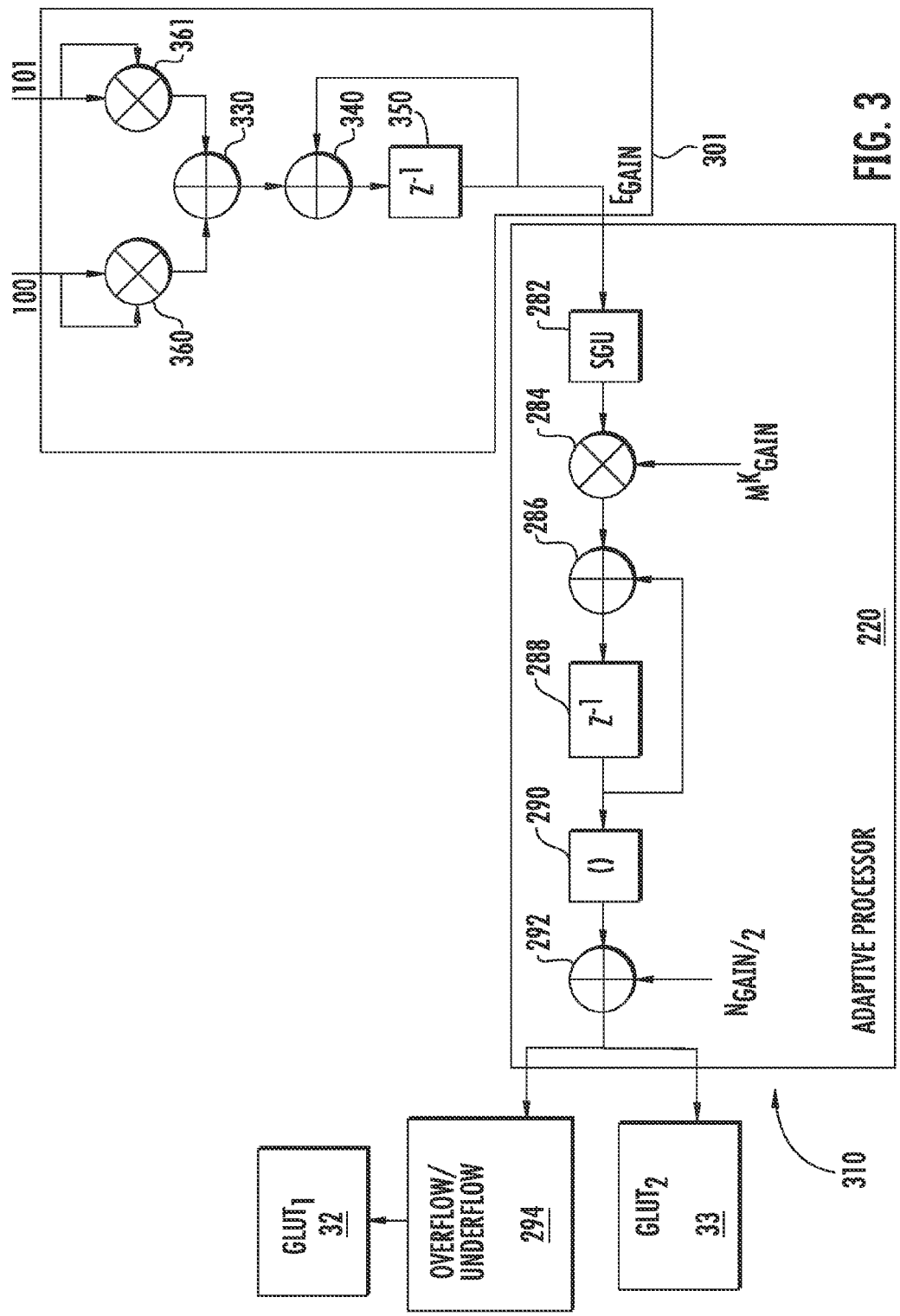
FIG. 3 is a block diagram of a gain correction unit in a two-channel TIADC.

FIG. 3 is a block diagram of a gain correction unit 310, including an error measurement block 301, within the DSP 60. Multipliers 360 and 361 square the signals from taps 100 and 101, respectively. The error measurement block 301 includes a subtractor 330 that takes the difference of the squared signals and forwards the difference to a feedback loop that includes an adder 340 and a delay register 350, which resets to zero every N samples. As in FIG. 2, the feedback loop transmits a gain error signal, $e_{gain}$, to an adaptive processor 220, which, in some embodiments, operates according to the algorithm described below. The adaptive processor 220 selects addresses of the GLUTs 32 and 33 in a manner that minimizes the gain error signal. The DSP 60 uses the output from the GLUTs 32 and 33 to control the gain of the ADCs 20 and 21 in a corresponding manner.

In a preferred embodiment, the adaptive processor 220 determines the sign of the gain error signal using a signum block 282, the output of which is multiplied with a gain step size $\mu_{gain}^k$ to control the value that adds to a bias $N_{gain}/2$ to produce the address for $GLUT_2$ 33, as shown in FIG. 3. The resulting product enters a feedback loop implemented with an adder 286 and a delay register 288. A rounding block 290 rounds the output of the feedback loop to form an address step, which may be biased by a bias value $N_{gain}/2$ using an adder 292. The biased address is then fed to GLUT$_2$ 33 and overflow/underflow block 294, which adjusts GLUT$_1$ 32 as necessary. As described above, the bias value and range of address locations depend on the particulars of the implementation.

Figure 4:
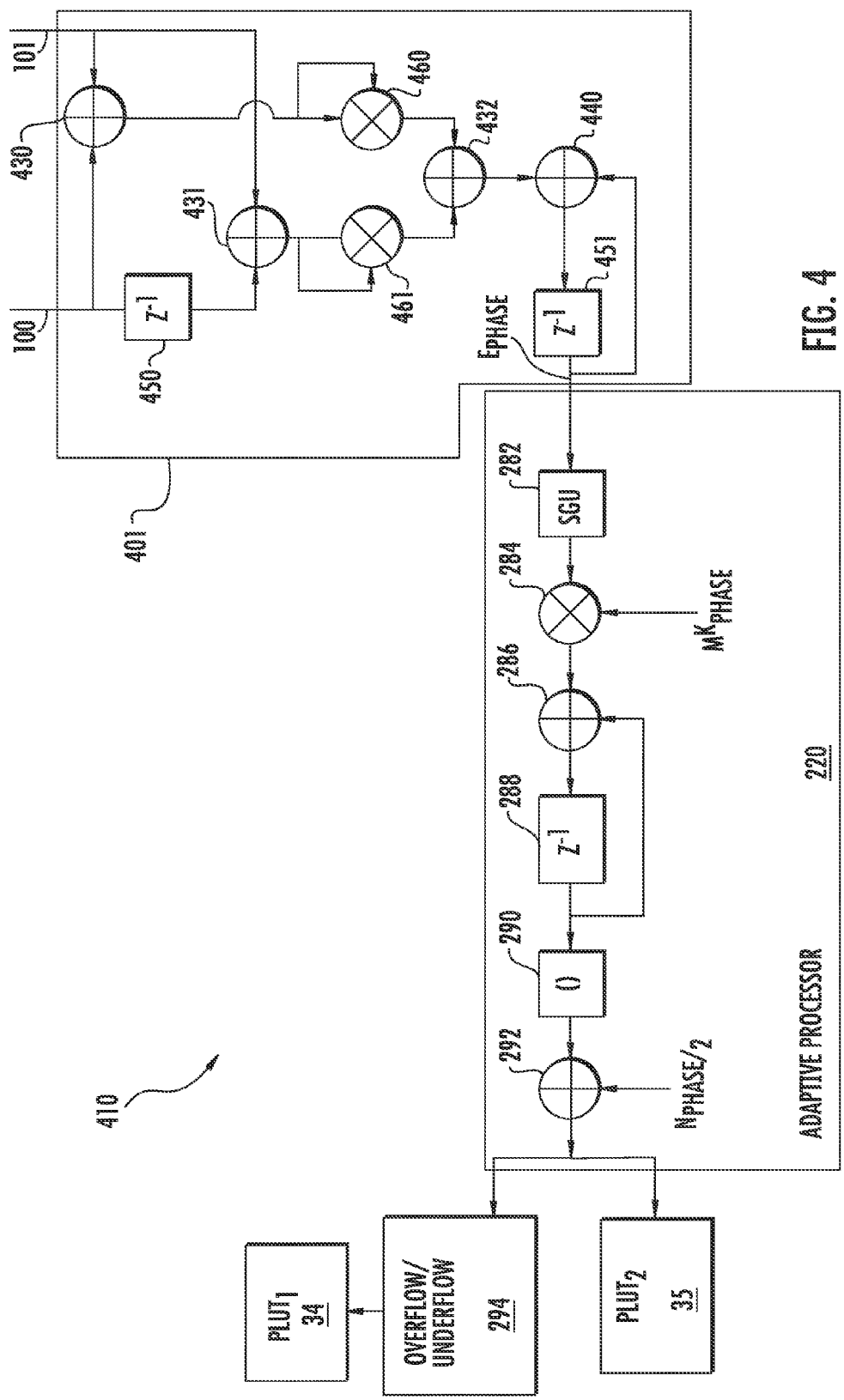
FIG. 4 is a block diagram of a phase correction unit in a two-channel TIADC.

FIG. 4 is a block diagram of a phase correction unit 410, including an error measurement block 401, within the DSP 60. The error measurement block 401 includes a subtractor 430 that feeds the difference of signals from the taps 100 and 101 into both input ports of a multiplier 460, which returns the square of the difference. A second subtractor 431 takes the difference of the signal from tap 101 and a version of the signal from tap 100 delayed by a delay register 450. The output of the subtractor 431 is squared with a second multiplier 461. A third subtractor 432 takes the difference of the outputs from the multipliers 460 and 461; the difference from the subtractor 432 enters a feedback loop including an adder 440 and a delay register 451 as in FIGS. 2 and 3. The feedback loop provides a phase error signal, $e_{phase}$, that drives an adaptive processor 220.

In some embodiments, the adaptive processor 220 operates according to the algorithm described below. As in the offset and gain correction units 210 and 310 shown in FIGS. 2 and 3, respectively, the adaptive processor 220 selects addresses in PLUT$_2$ 35 in a manner that minimize the phase error signal. The values corresponding to the selected addresses are used to control the phase error between the ADCs 20 and 21 in a corresponding manner. An overflow/underflow block 294 monitors the address setting and adjusts PLUT$_1$ 34 as necessary to keep PLUT$_2$ 35 within a given range.

In a preferred embodiment, the adaptive processor 220 determines the sign of the phase error signal using the signum block 282, the output of which is multiplied with a phase step size $\mu_{phase}^k$ to control the value that adds to a bias $N_{phase}/2$ to the produce the address for PLUT$_2$ 35, as shown in FIG. 4. The resulting product enters a feedback loop implemented with an adder 286 and a delay register 288. A rounding block 290 rounds the output of the feedback loop to form an address step, which may be biased by the bias value $N_{phase}/2$ using an adder 292. The biased address is then fed to PLUTs 32 and 33. As described above, the bias value and range of address locations depend on the particulars of the implementation.

Embodiments of the disclosed TIADC may use a single adaptive processor 220 to control all three sets of LUTs 30-35. In these embodiments, the offset, gain, and phase error correction are applied to the ADCs 20 and 21 in a sequential fashion (e.g., first correct the offset error, then the gain error, then the phase error, and repeat). Because all three correction units share a common adaptive processor 220, the resulting TIADC is smaller, lighter, more efficient, and simpler to manufacture than a TIADC with separate offset, gain, and phase correction units. Moreover, in other embodiments where performance is more important than size or cost, each adaptive processor 220 may be implemented with dedicated hardware or programmable processors.

Figure 5:
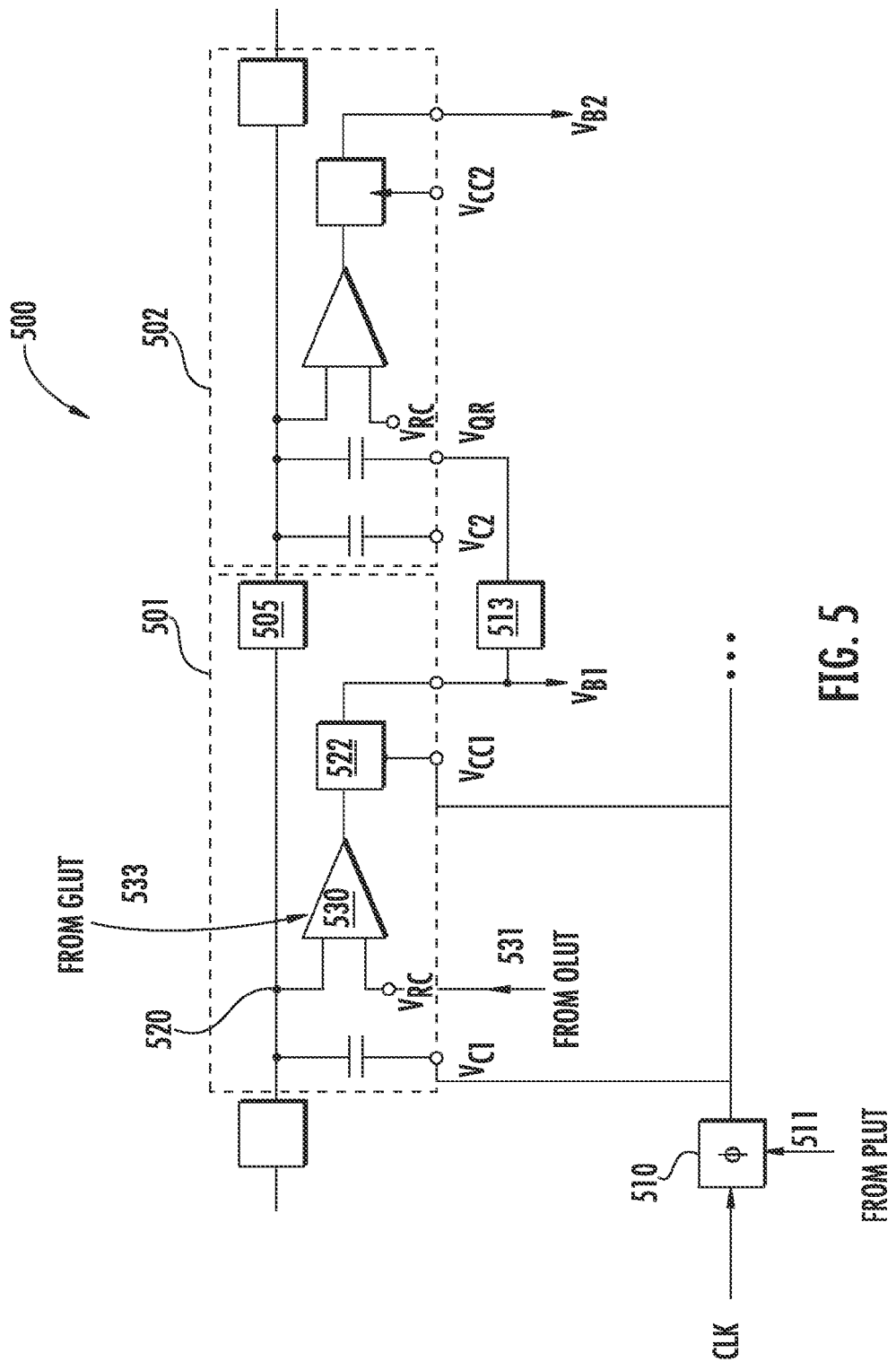
FIG. 5 is a block diagram of connections of offset, gain, and phase correction units to a stage of a charge-domain pipelined analog-to-digital converter (ADC).

FIG. 5 shows connections of outputs from gain, offset, and phase correction units to a first pipeline stage 501 of a charge-domain pipelined ADC 500 that can be used in the two-channel TIADC 10 of FIG. 1. Further description of the ADC 500 can be found in U.S. patent application Ser. No. 12/074,706 and U.S. Pat. No. 7,079,067, both of which are incorporated herein by reference in their entireties. First and second pipeline stages 501 and 502 incorporate charge-redistribution, charge-comparison, and charge-redistribution-driver circuits in a single-ended pipeline to provide two bits of analog-to-digital conversion. Adding additional stages to the pipeline provides additional bits of analog-to-digital conversion, where successive stages operate on charge packets that propagating through the pipeline in like fashion.

Charge packets are transferred into and out of the first pipeline stage 501 with a charge-transfer circuit 505 on alternating half-cycles of a clock signal CLK, causing the voltage at node 520 to change according to the size of the transferred charge packet. A comparator 530 compares the resulting voltage at node 520 to a reference voltage $V_{RC}$. A latch 522 latches the output from the comparator 530 once per clock cycle to produce a digital output $V_{B1}$. A charge-redistribution driver 513 receives $V_{B1}$ and outputs a charge-redistribution voltage signal $V_{QR}$ which to stage 502. The transition in $V_{QR}$ causes a corresponding change in the voltage at one node of a comparator in stage 502, meaning that the comparison result of stage 501 governs charge-redistribution in subsequent stage 502.

Outputs from the offset, gain, and phase correction units 210, 310, and 410 can be used to control various components of the pipeline stages. For example, an offset control signal 531 from an OLUT, such as OLUTs 30 and 31 in FIGS. 1 and 2, can be used to adjust the reference voltage $V_{RC}$. Similarly, a gain control signal 533 from a GLUT, such as GLUTs 32 and 33 in FIGS. 1 and 3, can be used to adjust the gain of the comparator 530. The clock phases $V_{C1}$ and $V_{CC1}$ can be retarded or advanced with a variable phase delay 510 controlled by a signal 511 from a PLUT, such as PLUTs 34 and 35. The variable phase delay 510 can be implemented with a delay-locked loop, dispersive delay line, or any other suitable delay, buffer, or memory element.

The offset, gain, and phase correction signals can be connected to some or all of the stages in a charge-domain pipeline ADC. In addition, different correction signals can be applied to different stages for finer control in correcting errors. Those skilled in the art will appreciate that the offset, gain, and phase correction signals can be connected in a similar fashion to any suitable ADC, including charge-domain pipeline ADCs.

Offset Error

Figure 6:
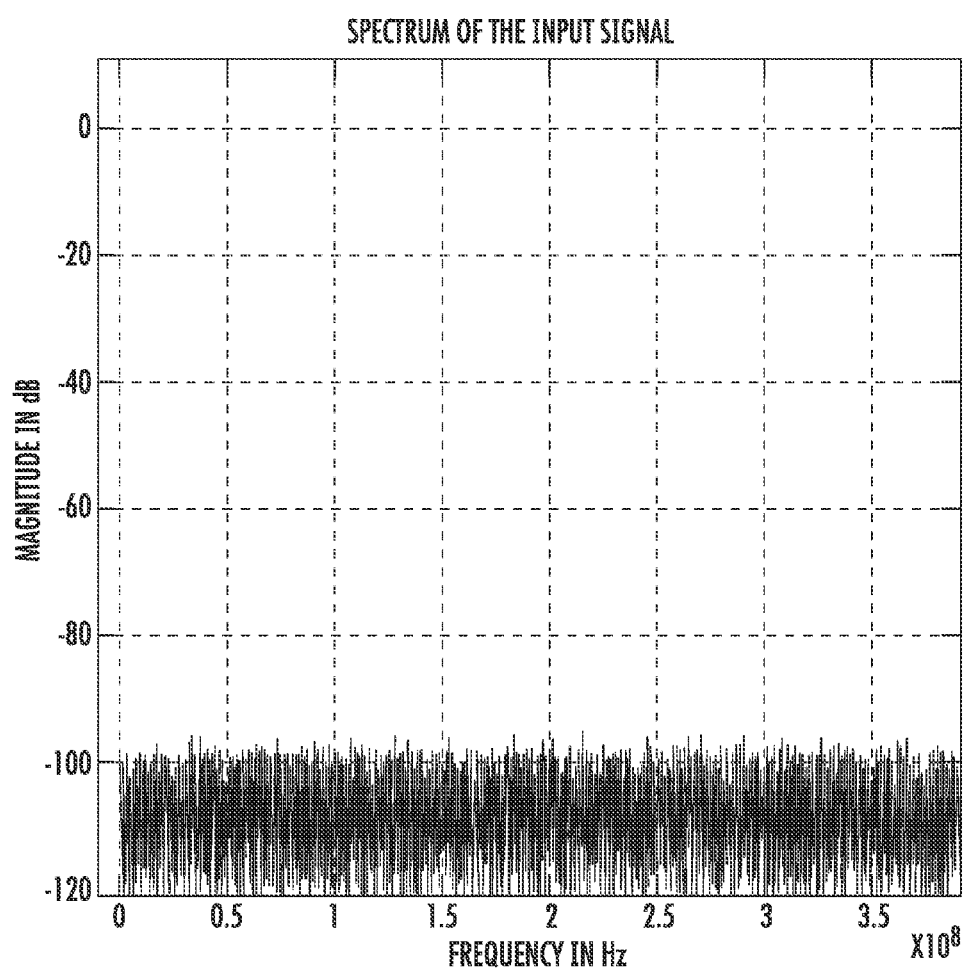
FIG. 6 is a plot of the spectrum of a signal with offset error.

In this section, we consider a two-channel TIADC 10 operating according to the present invention provides for the estimation and correction of offset error only. To see how offset error is corrected, we assume an input signal of $x(t)=\cos(\omega_o t+\phi)$, where $\omega_o$ is an arbitrary frequency and $\phi$ is an arbitrary phase of the input signal 12. The output 14 of the two-channel TIADC 10 is given by $$y(n) = \begin{cases} \cos(\omega_o nT + \phi) + V_1 & n = \text{even} \\ \cos(\omega_o nT + \phi) + V_2 & n = \text{odd} \end{cases} \quad (1)$$

where $V_1$ and $V_2$ are the offset values of ADC$_1$ 20 and ADC$_2$ 21, respectively, n is the sample number, and T is the sample period of the two-channel TIADC 10. Combining the output at even and odd time instants, we get $$y(n) = \cos(\omega_o nT + \phi) + V_1 + (1 - (-1)^n)V_d \quad (2)$$
$$= \cos(\omega_o nT + \phi) + V_s + (-1)^n V_d$$

where $$V_s = \frac{V_1 + V_2}{2} \quad (3)$$
$$V_d = \frac{V_2 - V_1}{2}$$

denote the average and difference in the offsets between two ADCs 20 and 21. Eqn. (2) can be written as $$y(n) = \cos(\omega_o nT + \phi) + V_s + \cos(\omega_s nT/2) V_d \quad (4)$$

where $\omega_s = 2\pi/T$ is the sampling frequency and $(-1)^n = \cos(\omega_s nT/2)$. It is clear from Eqn. (4) that the average offset between the two ADCs 20 and 21 creates a DC term while the difference in offsets creates a tone at the Nyquist frequency. In embodiments, the aim is to minimize the magnitude of the latter tone, i.e., the tone at the Nyquist frequency. As will be understood, it is fairly straightforward to minimize the average offset value once the difference in offset values is eliminated or minimized (e.g., by linearly shifting the relative offset between the ADCs 20 and 21 using the OLUTs 30 and 31). FIG. 6 shows the simulated spectrum of a 50 MHz tone with an offset error when the sampling frequency of the two-channel TIADC is 400 MHz. As can be seen from FIG. 6, there are two tones in the resulting spectrum that arise due to the offset error. The tone at DC corresponds to the average offset value between the two ADCs 20 and 21 while the tone at the Nyquist frequency corresponds to the difference in offset values between the two ADCs 20 and 21.

Figure 7:
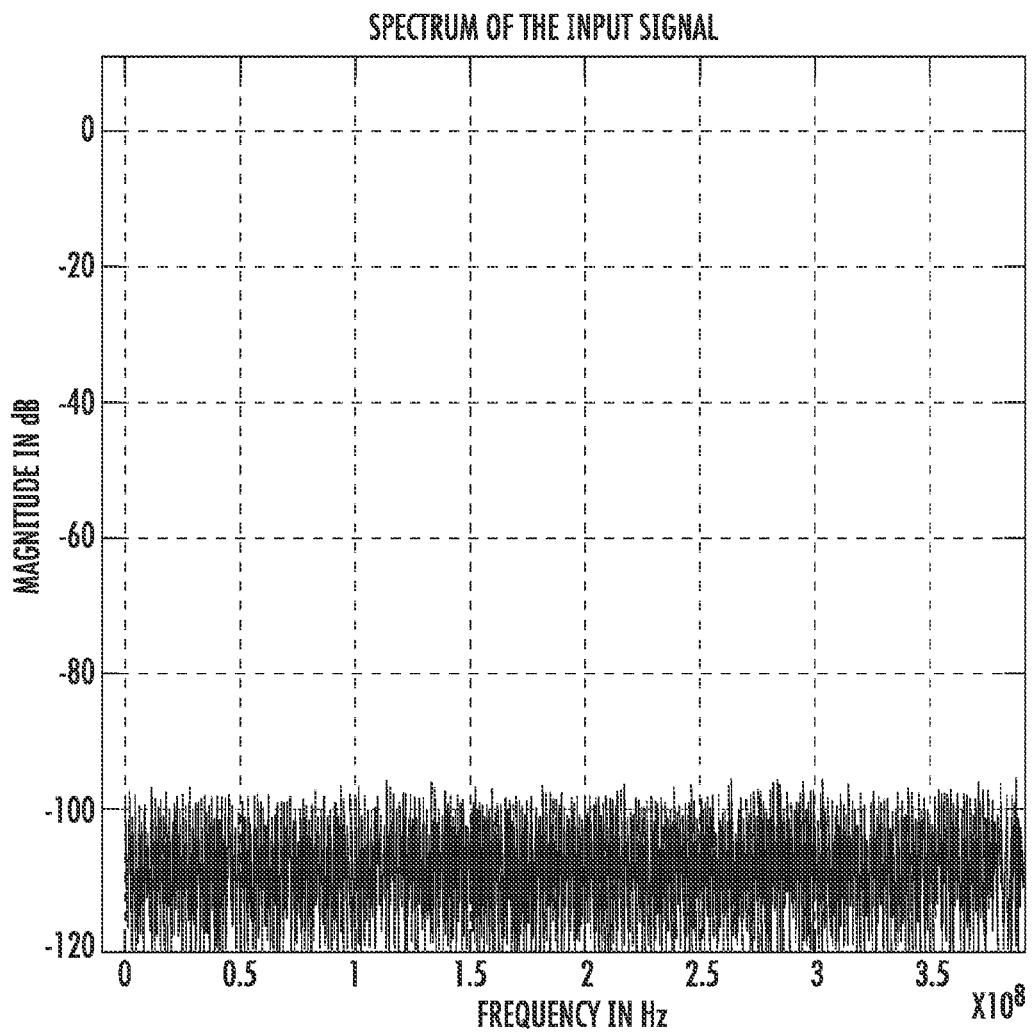
FIG. 7 is a plot of the spectrum of the signal of FIG. 6 with offset error correction.

FIG. 7 shows the simulated spectrum of the same signal after offset error correction as explained below. It can be seen that the tone at the Nyquist frequency due to the difference in offset values has been minimized. The amount of suppression of the tone at the Nyquist frequency depends upon the residual difference of offset between the two ADCs after correction. It can be seen that the tone at the Nyquist frequency is suppressed by more than 50 dB. Between FIGS. 6 and 7, it can be seen that the DC components are different. This is due to the fact that the offset of ADC$_2$ has been made approximately equal to that of ADC$_1$.

In order to minimize the magnitude of the tone at the Nyquist frequency, we need to obtain the information of the signal at this frequency. Towards this end, let $y_1(n)$ and $y_2(n)$ correspond to the outputs from the ADC$_1$ 20 and ADC$_2$ 21, respectively. The N-point DFT of $y(n)$ corresponding to $\omega_s/2$ is given by $$Y(\omega = \omega_s/2) = \frac{1}{N}(y_1(n) - y_2(n) + y_1(n-1) - y_2(n-1) + \ldots) \quad (5)$$
$$= e_{offset}$$

where $$e_{offset} = \frac{1}{N} \sum_{k=0}^{N-1} (y_1(n-k) - y_2(n-k)) \quad (6)$$

From Equation 6, it is evident that by making $e_{offset} \approx 0$, we can minimize the magnitude of the tone at the Nyquist frequency. The calculation of $e_{offset}$ corresponds to taking the difference of the mean or, alternatively, the mean of the difference of the outputs from the two ADCs 20 and 21 over N samples. The larger the value of N, the more accurate the estimate. The number of samples can be varied depending on the processor and the application: two-way communication (e.g., communication over an Ethernet connection) typically requires fast convergence, or smaller values of N. For example, when N=1, every sample undergoes a correction. One-way communication, as in cable modems, does not require such fast convergence and can be accomplished with more samples (i.e., larger values of N).

The OLUTs 30 and 31, each of size $N_{offset}$, include entries that can be used to directly or indirectly control the offset in each of the ADCs 20, 21. Since we are dealing with the estimation and correction as a mixed-domain process, there is no loss of generality if the OLUTs 30, 31 act as interfaces between the analog and digital domains. The addresses of the OLUTs 30 and 31 are evaluated using an adaptive algorithm, such as the one described below, in the digital domain while the outputs of the OLUTs 30 and 31 directly or indirectly provide the corresponding offset correction in the analog domain. To illustrate, let the maximum difference in offsets between the two ADCs be $\pm X_o$ least significant bits (LSBs). In a typical 12-bit TIADC, the maximum tolerable difference in offsets will be about 60 LSBs, or about 3% of the total bit width. The entries of the OLUTs 30 and 31 are designed to cover this range using a linear, logarithmic, or any other distribution depending upon the analog circuitry. For a linear distribution, an entry in the OLUTs 30 and 31 differs from the next entry by $2X_o/N_{offset}$ LSBs. In a preferred embodiment, the entries in the OLUTs 30 and 31 are distributed linearly near the zero-error point and logarithmically near the edges of the distribution.

Referring again to the two-channel TIADC 10 shown in FIG. 1, consider that the address of the OLUT$_1$ 30 of ADC$_1$ 20 is such that the output from the OLUT$_1$ 30 is zero. As noted above, OLUT$_1$ 30 is associated with ADC$_1$ 20 and OLUT$_2$ 31 is associated with ADC$_2$ 21. For the case when the two OLUTs 30 and 31 have a linear distribution of offset values as a function of OLUT address, the DSP 60 sets the address of OLUT$_1$ 30 to $N_{offset}/2$.

Figure 8:
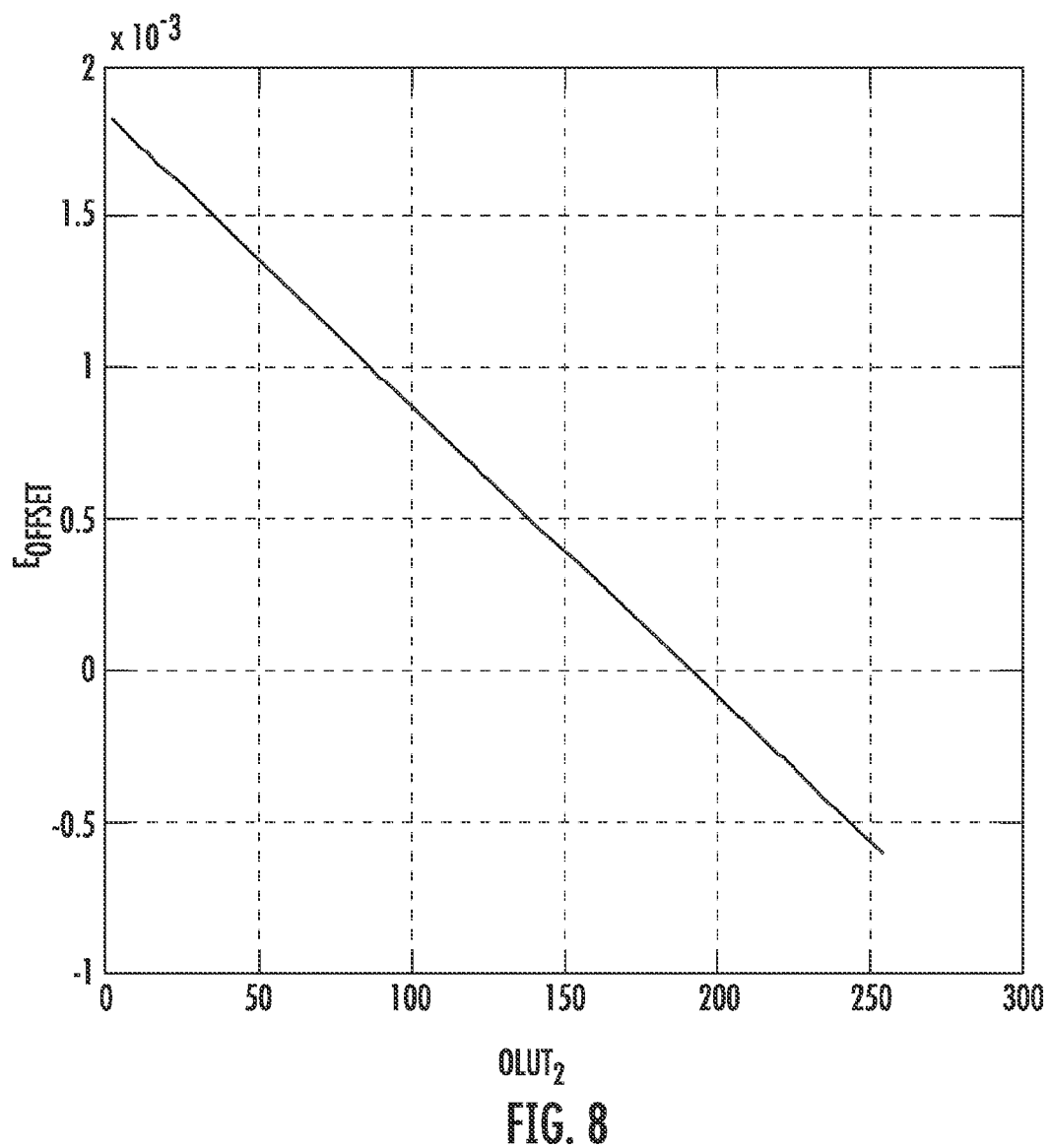
FIG. 8 is a plot of variation of $e_{offset}$ with $OLUT_2$ address.

As an example, FIG. 8 shows the variation of $e_{offset}$ with the address of OLUT$_2$ 31 with $N_{offset}$=256 based on Eq. (6). The address of OLUT$_1$ is 128 which means that the output from OLUT$_1$ is zero assuming a linear distribution of values in the OLUTs. From FIG. 8, it is evident that $e_{offset}$ is a linear variation between the two extremities of the offset errors. It can be seen that the error function passes through zero for a specific address of OLUT$_2$ 31. In this case the optimum address for OLUT$_2$ 31 is 192. As described below, the DSP 60 uses an adaptive algorithm to seek the address of OLUT$_2$ 31 that minimizes the absolute value of $e_{offset}$. In a preferred embodiment, the adaptive algorithm is based on the sign of $e_{offset}$ and hence is extremely hardware efficient.

Algorithm for Offset Error Correction

Assuming a linear distribution of values in the OLUTs 30 and 31, the DSP 60 sets the address of OLUT$_1$ 30 to $N_{offset}/2$. Let OLUT$_2^k$ denote the address of OLUT$_2$ 31 at the kth iteration. Let $\mu_1^k$ denote a variable at the kth iteration and let $\mu_{offset}^k$ denote a step size for the adaptive algorithm at the kth iteration. Here, we assume that $$\mu_{offset}^k \in [\mu_{offsetmin}, \mu_{offsetmax}] \quad (7)$$

where $\mu_{offsetmin}$ and $\mu_{offsetmax}$ are the minimum and maximum values, respectively, of $\mu_{offset}^k$. The adaptive algorithm for correcting the offset error can now be written as $$OLUT_2^k = \frac{N_{offset}}{2} + \text{round}(\mu_1^k) \quad (8)$$
$$\mu_1^{k+1} = \mu_1^k + \text{sign}(e_{offset}) \mu_{offset}^k$$
$$\mu_{offset}^{k+1} = \max\left(\frac{\mu_{offset}^k}{2}, \mu_{offsetmin}\right) \text{ if } k = k_1$$

where $\mu_1^1 = 0$, $\mu_{offset}^1 = \mu_{offsetmax}$ and $k_1$ is any arbitrary positive number. As can be seen from Equation 8, $\mu_1^k$ provides the update of the address of OLUT$_2$ 31 based on the sign of $e_{offset}$.

Figure 9:
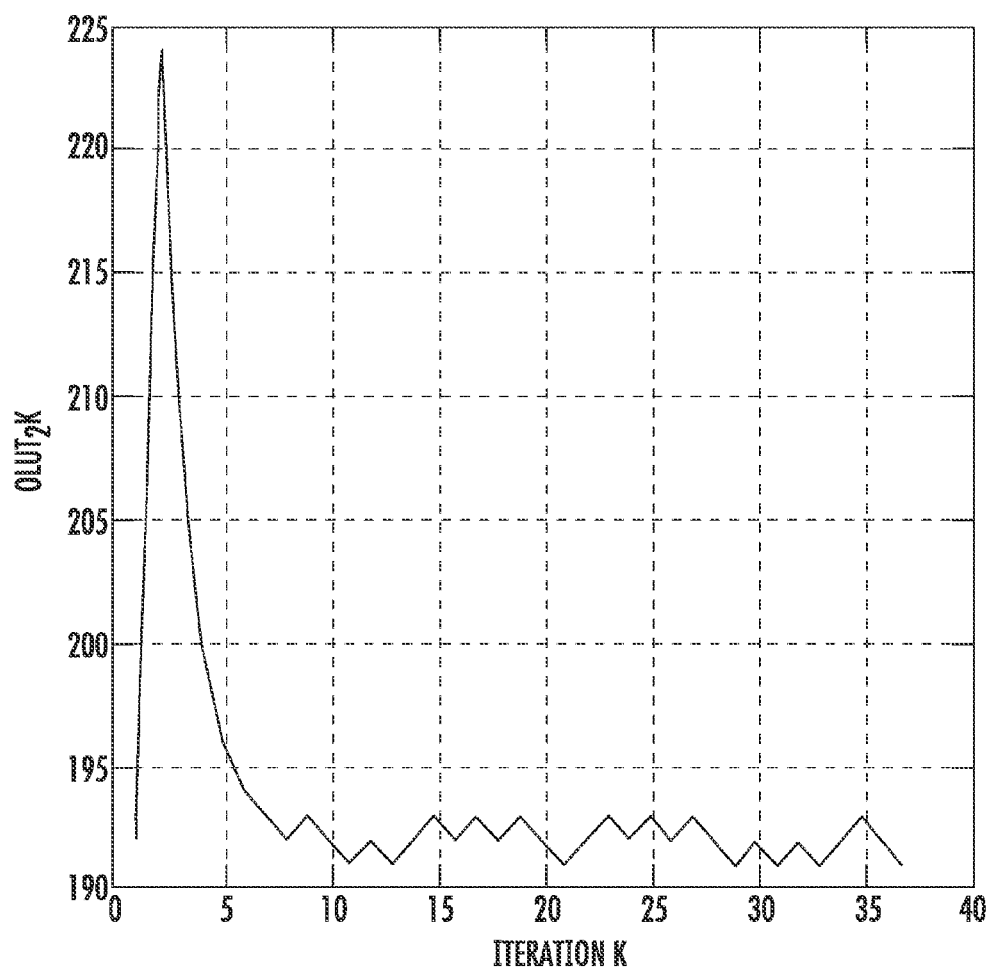
FIG. 9 is a plot of variation of $OLUT_2^k$ address with iteration k.

At convergence, $OLUT_2^k$ indicates the optimal address of $OLUT_2$ 31 that produces the minimum absolute value of $e_{offset}$. For the example quoted earlier, FIG. 9 shows the convergence of $OLUT_2^k$ with iteration k. As can be seen from FIG. 9, in about 7 iterations, the $OLUT_2^k$ converges to an address around 192, which is the optimum address corresponding to the zero crossing value of $e_{offset}$ shown in FIG. 8.

We now explain the operation of the adaptive algorithm using a set of parameters. Towards this end, we choose $\mu_{offsetmax}=64$, $\mu_{offsetmin}=1$, and $k_1=1$. The address of the $OLUT_1$ is set to 128 and $\mu_{offset}^1=64$. In the first iteration, based on the sign of $e_{offset}$, $\mu_1^2$ is obtained. FIG. 9 shows that the sign of $e_{offset}$ is positive and hence that $\mu_1^2=64$ and $\mu_{offset}^2=32$. Hence, in iteration 2, the address of $OLUT_2$ 31 is set to 192. Ideally at this stage the sign of $e_{offset}$ should be zero (Recall that the zero crossing of $e_{offset}$ for this case occurs when the address of $OLUT_2$ is 192). However, due to quantization and rounding errors, the sign of $e_{offset}$ is positive. Now $\mu_1^3=96$ and $\mu_{offset}^3=16$. The address of $OLUT_2$ 31 in iteration 3 is 224. The algorithm continues in this fashion until the optimum value of the address of $OLUT_2$ 31 is obtained. Such a search for finding the optimal value of the address of $OLUT_2$ 31 is termed a binary search.

It is not necessary to fix the address of $OLUT_1$ 30 at $N_{offset}/2$. If, during an iteration k in the adaptation process for offset correction, the address of $OLUT_2$ 31 exceeds the boundaries $[N_1^o, N_2^o]$, where $N_1^o \geqq 1$ and $N_2^o \leqq N_{offset}$, for example, the address of $OLUT_1$ 30 can be appropriately changed and the adaptation restarted.

Gain Error

In this section, we consider a two-channel TIADC 10 with gain error only. Again, assuming an input signal 12 of $x(t)=\cos(\omega_o t+\phi)$, the output 14 of the two-channel TIADC 10 is given by $$y(n) = \begin{cases} G_1 \cos(\omega_o nT + \phi) & n = \text{even} \\ G_2 \cos(\omega_o nT + \phi) & n = \text{odd} \end{cases} \quad (9)$$

where $G_1$ and $G_2$ are the gains provided by $ADC_1$ 20 and $ADC_2$ 21, respectively. Combining the output 14 at even and odd time instants, we get $$y(n) = G_1 \cos(\omega_o nT + \phi) + (1 - (-1)^n) G_d \cos(\omega_o nT + \phi) \quad (10)$$
$$= [G_s + (-1)^n G_d] \cos(\omega_o nT + \phi)$$

where $$G_s = \frac{G_1 + G_2}{2} \quad (11)$$
$$G_d = \frac{G_1 - G_2}{2} = \frac{G_1}{2}\left(1 - \frac{G_2}{G_1}\right)$$

Again, using $$(-1)^n = \cos\left(\frac{\omega_s}{2} nT\right),$$

Eqn. (10) can be re-written as $$y(n) = G_s \cos(\omega_o nT + \phi) + G_d \cos\left[\left(\omega_o - \frac{\omega_s}{2}\right) nT + \phi\right] \quad (12)$$

Figure 10:
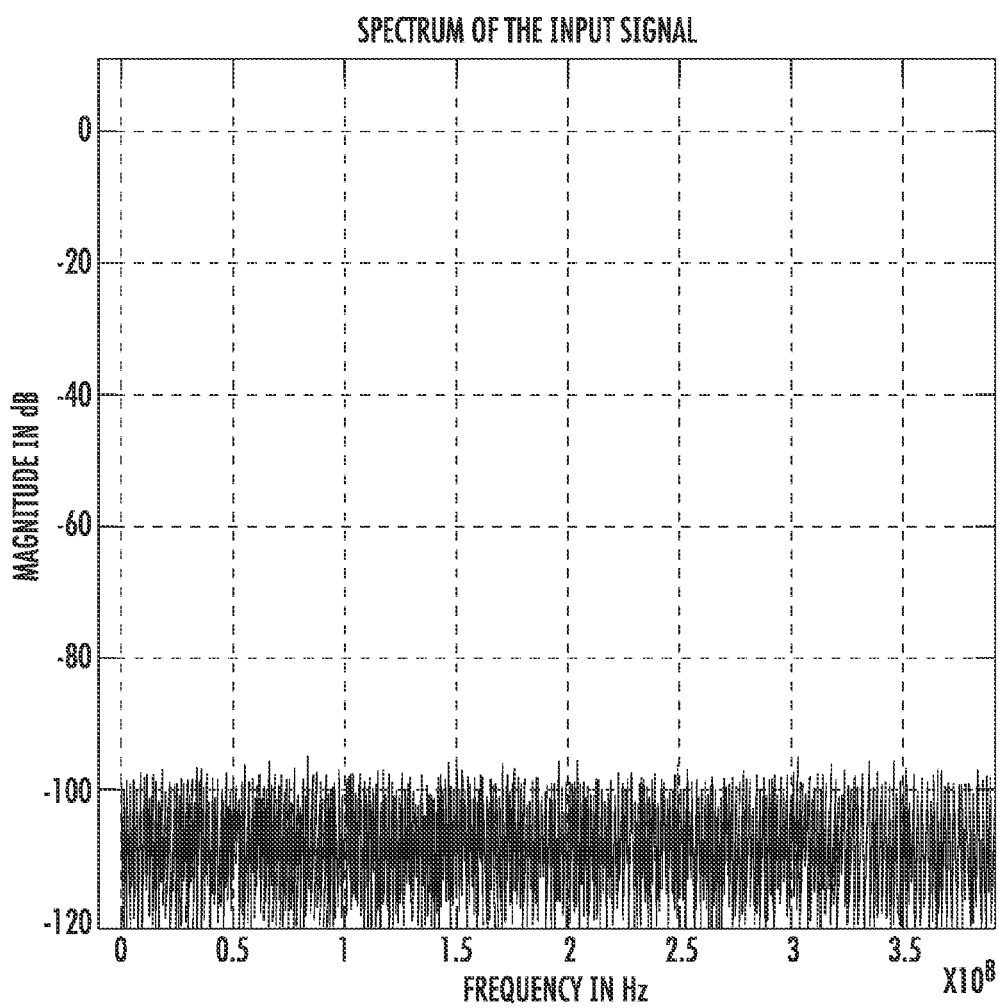
FIG. 10 is a plot of the spectrum of a signal with gain error.
Figure 11:
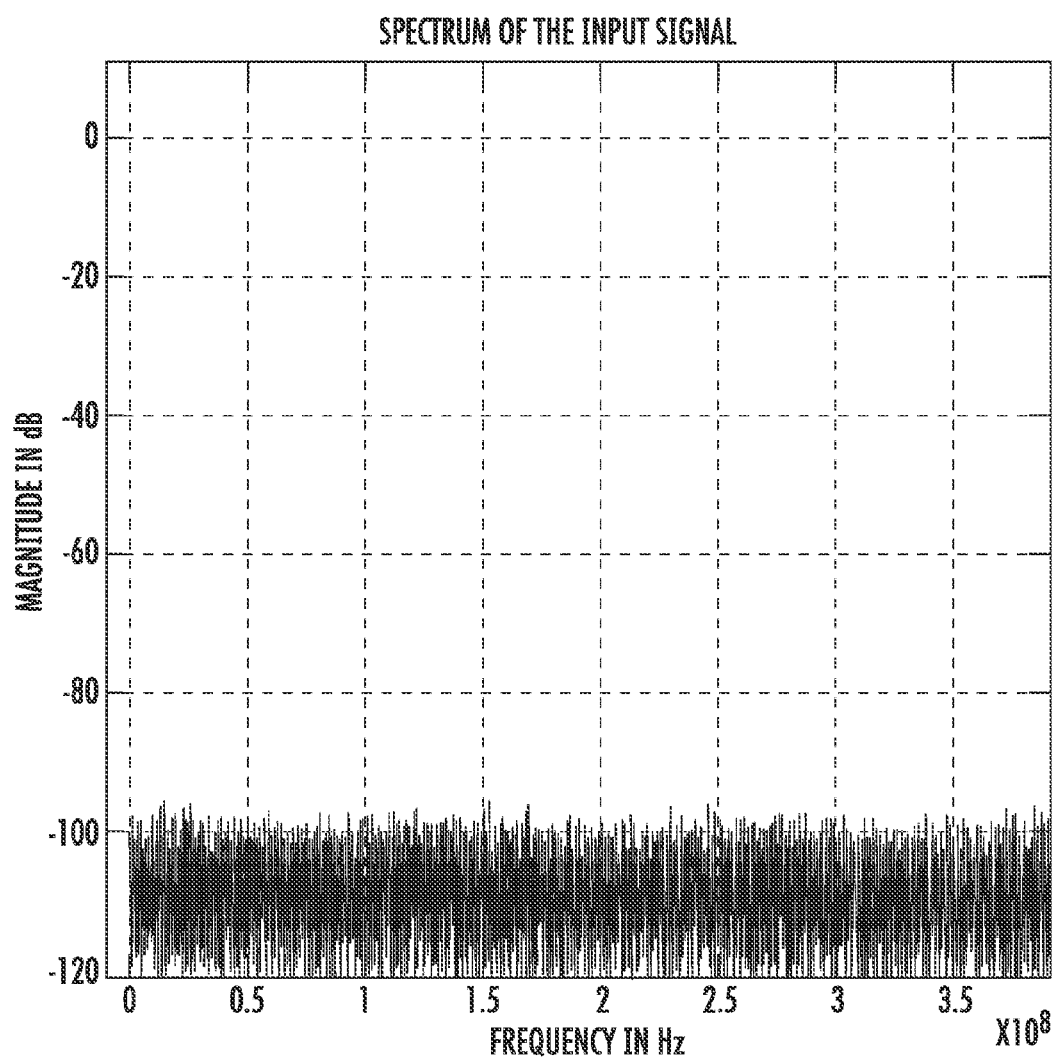
FIG. 11 is a plot of the spectrum of the signal of FIG. 10 with gain error corrected.

Equation 12 shows that the gain mismatch produces an image tone reflected around $\omega_s/2$ and that the amplitude of the image tone is proportional to the difference in gain values between the two ADCs 20 and 21. It can also be seen that the input signal is scaled by the average value of the gains of the two ADCs 20 and 21. This need not be a concern since an Automatic Gain Control (AGC) loop is usually employed to correct for such errors. FIG. 10 shows the simulated spectrum of a 50 MHz tone with a gain error when the sample frequency of the two-channel TIADC 10 is 400 MHz. As can be seen from FIG. 10, there is an image tone at 150 MHz. The amount of suppression depends upon the difference in the gain values of the two ADCs 20 and 21. Alternatively, it depends upon the difference between the ratio of the gain values of the two ADCs 20 and 21 and unity. FIG. 11 shows the simulated spectrum of the same signal after applying the gain correction described below. It can be seen that gain correction reduces the image tone by more than 25 dB.

The minimization of the difference in gain values between the two ADCs 20 and 21 can be accomplished by minimizing the difference in the power of the signals on the two ADCs 20 and 21. Towards this end, a gain error function can be formulated as $$e_{gain} = \frac{1}{N} \sum_{k=0}^{N-1} (y_1(n-k)^2 - y_2(n-k)^2) \quad (13)$$

It can be noted from the above equation that $e_{gain}$ can be made approximately equal to zero provided a variable $k_{gain}$ can be found such that $$\sum_{k=0}^{N-1} y_1(n-k)^2 \approx k_{gain} \sum_{k=0}^{N-1} y_2(n-k)^2 \quad (14)$$

As shown in FIG. 1, the DSP 60 uses GLUTs 32 and 33 to directly or indirectly control the gain of the output of each ADC 20 and 21, respectively. The distribution in each GLUT 32 and 33 can be linear, logarithmic or any other distribution. If the maximum variation of the ratio of the gains of the two ADCs is $(1 \pm X_g)$, then the GLUTs are designed to cover the entire range of $2X_g$. In a preferred embodiment, $X_g \leqq 2\%$, meaning that the tolerable range of gains is 0.98-1.02 times the nominal gain value.

Figure 12:
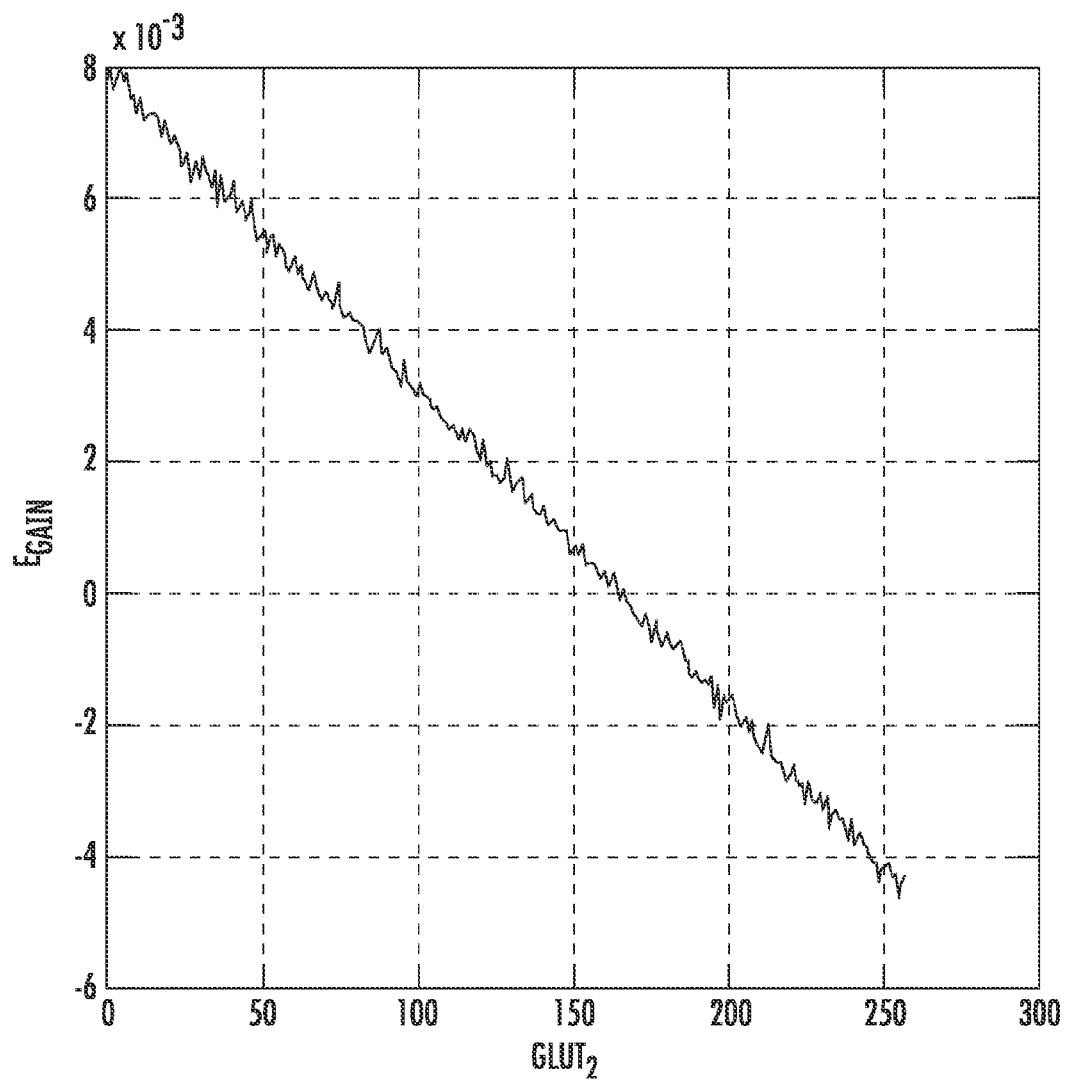
FIG. 12 is a plot of variation of $e_{gain}$ with $GLUT_2$ location.

Just as in the case of offset estimation and correction, we assume that address of $GLUT_1$ 32 is such that the output from it is unity. As an example we assume a linear distribution of values in the GLUTs 32 and 33, where the size of each GLUT 32 and 33 is $N_{gain}$. FIG. 12 shows the variation of $e_{gain}$ with the address of $GLUT_2$ 33 based on Eq. (13). In the embodiment shown here, $N_{gain}=256$, although $N_{gain}$ can take any suitable value. Although the error variation is not linear, it is fairly well behaved in terms of linearity. As is evident from FIG. 12, the region of zero crossing of $e_{gain}$ corresponds to the optimal address of $GLUT_2$ 33. In FIG. 12, the minimum of the absolute value of $e_{gain}$ corresponds to $GLUT_2$ address of 162.

Algorithm for Gain Error Correction

Figure 13:
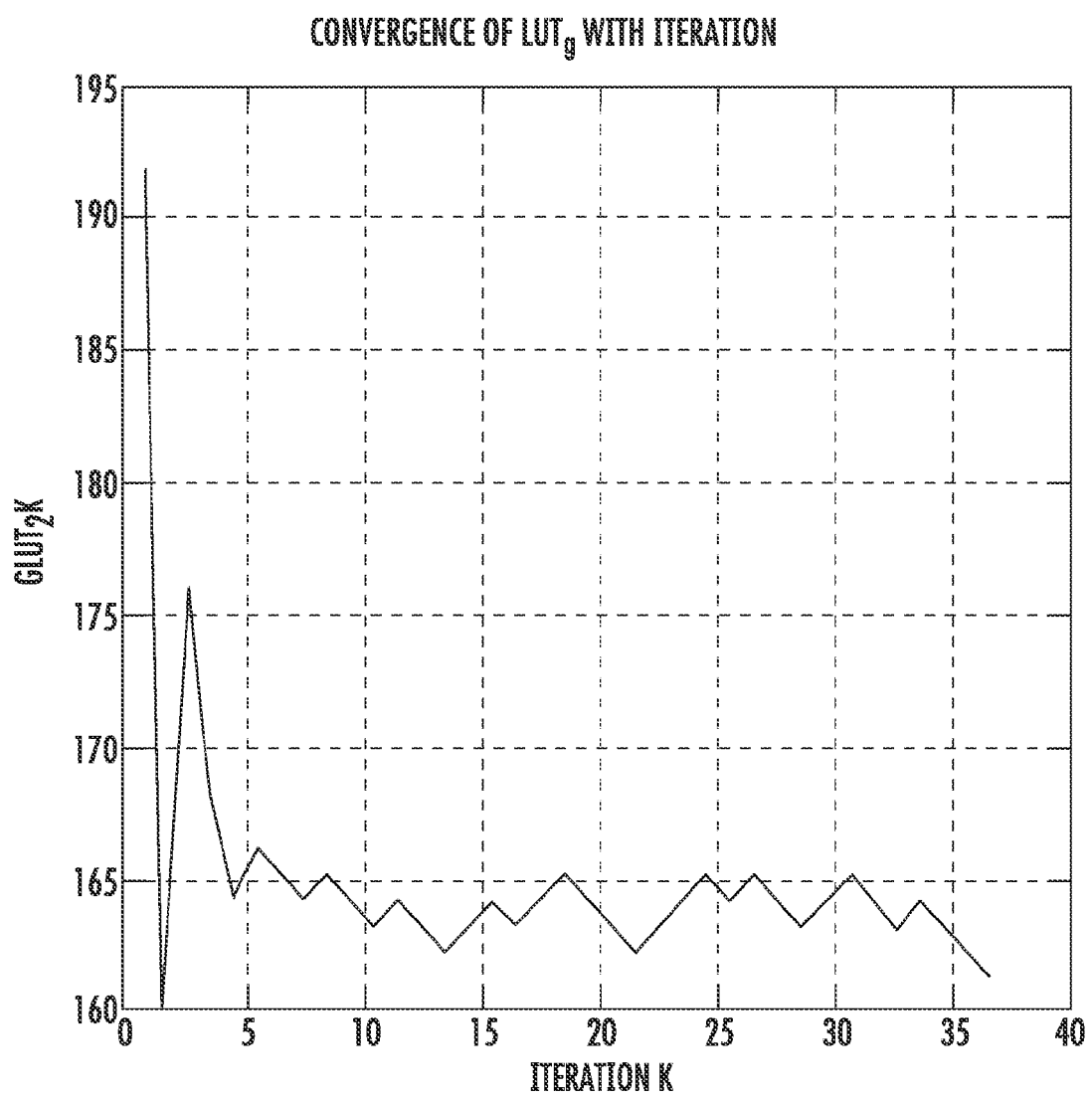
FIG. 13 is a plot of variation of address of $GLUT_2^k$ with iteration k.

Assuming a linear distribution in the GLUTs, the DSP 60 sets the address of $GLUT_1$ 32 to $N_{gain}/2$. Let $GLUT_2^k$ denote the location of $GLUT_2$ 33 at the kth iteration. Let $\mu_2^k$ denote a variable at the kth iteration, and let $\mu_{gain}^k$ denote a step size for the adaptive algorithm at the kth iteration. Here, we assume $$\mu_{gain}^k \in [\mu_{gainmin}, \mu_{gainmax}] \quad (15)$$

where $\mu_{gainmin}$ and $\mu_{gainmax}$ are the minimum and maximum values, respectively, of $\mu_{gain}^k$. The adaptive algorithm for correcting the gain error can be written as $$GLUT_2^k = \frac{N_{gain}}{2} + \text{round}(\mu_2^k) \tag{16}$$

$$\mu_2^{k+1} = \mu_2^k + \text{sign}(e_{gain})\mu_{gain}^k$$

$$\mu_{gain}^{k+1} = \max\left(\frac{\mu_{gain}^k}{2}, \mu_{gainmin}\right) \text{if } k = k_2$$

where $\mu_2^1=0$, $\mu_{gain}^1=\mu_{gainmax}$ and $k_2$ is any arbitrary positive number. As can be seen from the above adaptive algorithm, $\mu_2^k$ provides the update of the address of $GLUT_2$ 33 based on the sign of $e_{gain}$. At convergence, $GLUT_2^k$ indicates the optimal address of $GLUT_2$ 33 that produces the minimum absolute value of $e_{gain}$. For the example quoted earlier, FIG. 13 shows the convergence of $GLUT_2^k$ with iteration k, assuming $N_{gain}=256$. As can be seen from FIG. 13, in about 7 iterations, the $GLUT_2^k$ converges to an address around 162, which is the optimum address corresponding to the zero crossing value of $e_{gain}$ shown in FIG. 12.

It must be noted that it is not necessary to fix the address of $GLUT_1$ 32 at $N_{gain}/2$. If during an iteration k in the adaptation for gain correction, the address of $GLUT_2$ 32 exceeds the boundaries $[N_1^g, N_2^g]$, where $N_1^g \geq 1$ and $N_2^g \leq N_{gain}$, for example, the address of $GLUT_1$ 32 can be appropriately changed and the adaptation restarted.

Phase Error

In this section, we consider the two-channel TIADC 10 with phase error only. Again, assuming an input signal 12 of $x(t)=\cos(\omega_o t+\phi)$, the output 14 of the two-channel TIADC 10 is given by $$y(n) = \cos\left(\omega_o t\left[nT + \frac{\Delta t}{2} - (-1)^n \frac{\Delta t}{2}\right] + \phi\right) \tag{17}$$

Here it is assumed that $ADC_1$ 20 samples at time instants $2nT$ while $ADC_2$ 21 samples at time instants $(2n+1)T+\Delta t$. Consequently, $\Delta t$ is the sample-time error. The above equation can be rewritten as $$y(n) = \cos\left[\omega_o\left(nT + \frac{\Delta t}{2}\right) + \phi\right]\cos\left[(-1)^n \frac{\omega_o \Delta t}{2}\right] + \tag{18}$$
$$\sin\left[\omega_o\left(nT + \frac{\Delta t}{2}\right) + \phi\right]\sin\left[(-1)^n \frac{\omega_o \Delta t}{2}\right]$$

It can be seen that $\cos[(-1)^n \omega_o\Delta t/2]=\cos[\omega_o\Delta t/2]$. Since the sine function is an odd function, with $(-1)^n=\cos(n\pi)$, we get $\sin[(-1)^n \omega_o\Delta t/2]=\cos(n\pi)\sin[\omega_o\Delta t/2]$. Using $\sin(a)\cos(n\pi)=\sin(a-n\pi)$ and $n\pi=\omega_s nT/2$, the above equation can be written as $$y(n) = \cos\left[\frac{\omega_o \Delta t}{2}\right]\cos\left[\omega_o nT + \frac{\omega_o \Delta t}{2} + \phi\right] + \tag{19}$$
$$\sin\left[\frac{\omega_o \Delta t}{2}\right]\sin\left[\omega_o nT + \frac{\omega_o \Delta t}{2} - \frac{\omega_s nT}{2} + \phi\right]$$
$$= \cos\left[\frac{\omega_o \Delta t}{2}\right]\cos\left[\omega_o nT + \frac{\omega_o \Delta t}{2} + \phi\right] +$$
$$\sin\left[\frac{\omega_o \Delta t}{2}\right]\sin\left[\left(\omega_o - \frac{\omega_s}{2}\right)nT + \frac{\omega_o \Delta t}{2} + \phi\right]$$

Assuming that $\Delta t$ is small compared to $1/\omega_o$, $\cos(\omega_o\Delta t/2)\approx 1$ and $\sin(\omega_o\Delta t/2)\approx\omega_o\Delta t/2$. Consequently, $$y(n) \approx \cos\left[\omega_o nT + \frac{\omega_o \Delta t}{2} + \phi\right] + \tag{20}$$
$$\frac{\omega_o \Delta t}{2}\sin\left[\left(\omega_o - \frac{\omega_s}{2}\right)nT + \frac{\omega_o \Delta t}{2} + \phi\right]$$
$$\approx \cos\left[\omega_o nT + \frac{\omega_o \Delta t}{2} + \phi\right] -$$
$$\frac{\omega_o \Delta t}{2}\sin\left[\left(\frac{\omega_s}{2} - \omega_o\right)nT - \frac{\omega_o \Delta t}{2} - \phi\right]$$

Figure 14:
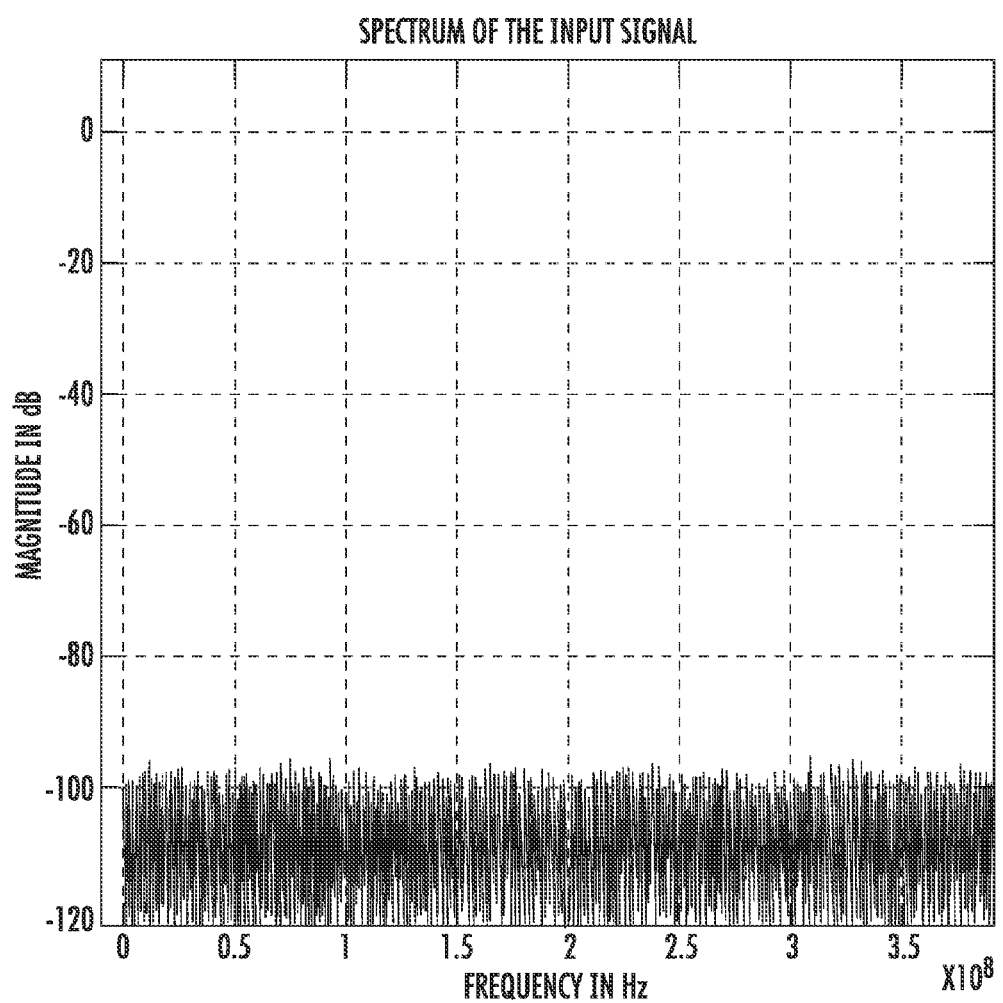
FIG. 14 is a plot of the spectrum of a signal with phase error.
Figure 15:
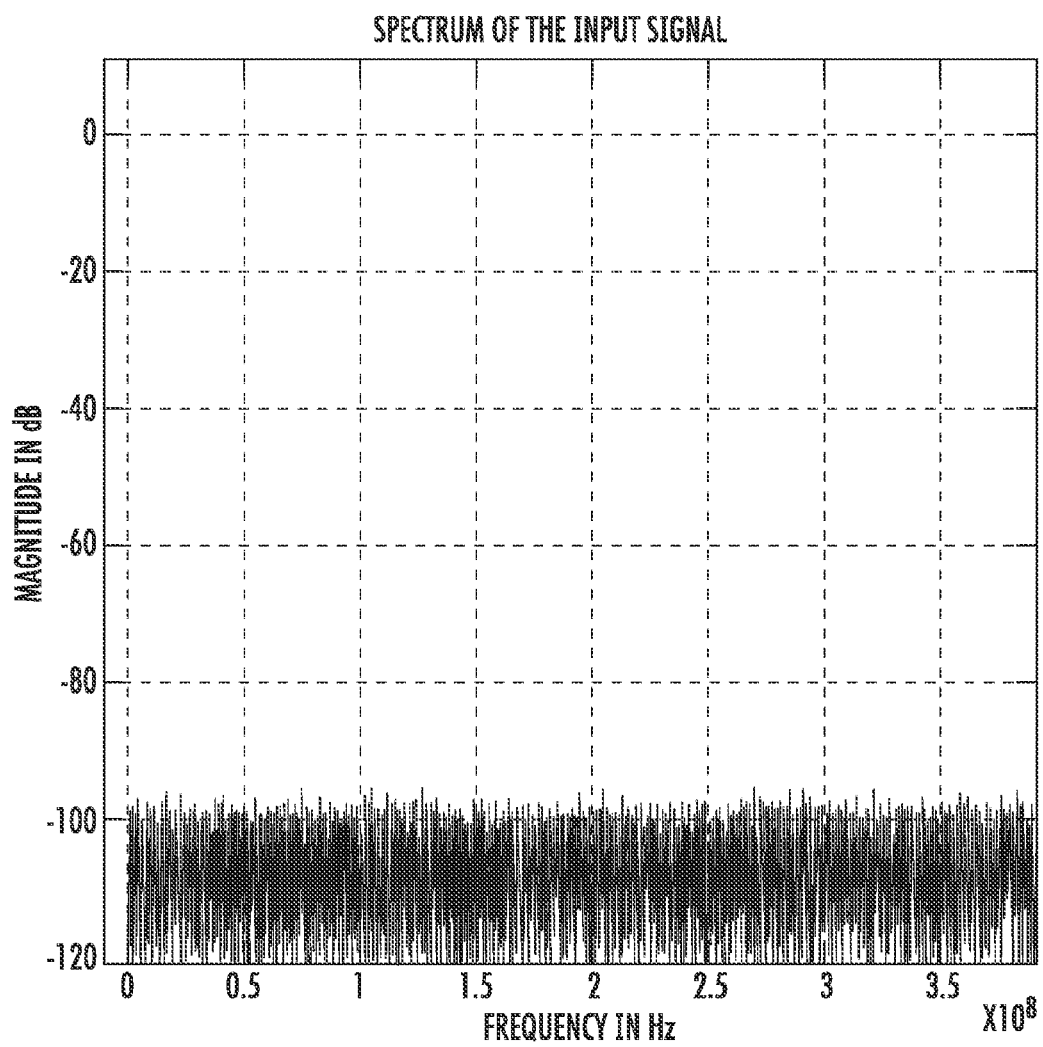
FIG. 15 is a plot of the spectrum of the signal of FIG. 14 after phase error correction.

We can now see from the above equation that the phase error produces an image tone with an amplitude proportional to the phase error $\Delta t$. It is interesting to note that the image tone is $\pi/2$ out of phase with the tone produced due to gain error. FIG. 14 shows the simulated spectrum of a signal with a tone at 50 MHz. Again, a sample frequency of 400 MHz is assumed. As can be seen from FIG. 14, there is an image tone at 150 MHz arising from the phase error. FIG. 15 shows the simulated spectrum of the same signal after phase correction; the image tone has been suppressed by more than 25 dB. The amount of suppression depends upon how closely $\Delta t$ approximates zero.

As is well known, a correlation between two sequences provides information about the time delay between them. Towards this end, we now define a phase error given by $$e_{phase} = \frac{1}{N}\sum_{k=0}^{N-1}\{y_1(n-k)y_2(n-k) - y_2(n-k)y_1(n+1-k)\} \tag{21}$$
$$= \frac{1}{N}\sum_{k=0}^{N-1}y_2(n-k)\{y_1(n-k) - y_2(n+1-k)\}$$

An alternative expression for the phase error given by $$e_{phase} = \frac{1}{N}\sum_{k=0}^{N-1}\{y_1(n-k) - y_2(n-k)\}^2 - \{y_2(n-k) - y_1(n+1-k)\}^2 \tag{22}$$

also provides information about the phase error between the two ADCs 20, 21.

As in the offset and gain correction presented above, the DSP 60 use PLUTs 34 and 35, each of size $N_{phase}$, to directly or indirectly control the phase of the clock signal 45 to each of the ADCs 20, 21. The addresses of the PLUTs 34, 35 are evaluated using an adaptive algorithm in the digital domain while the outputs of the PLUTs 34, 35 directly or indirectly provide the corresponding delay in the clock signal 45 used to control the ADCs 20, 21. Let the maximum phase delay between the two ADCs 20, 21 be$\pm X_p$ units, where the entries of the PLUT 34, 35 are designed to cover this range. In a preferred embodiment, the maximum phase delay is about 0.3% of the period, or a time delay of $\pm 5.75$ ps for a sample frequency of 500 MHz (i.e., a sample period of 2 ns). The units for $\pm X_p$ may be in seconds, radians, or fractions of the sample frequency and the entries of the PLUTs 34, 35 can follow linear, logarithmic or any other distribution depending upon the analog circuitry effecting the correction.

Figure 16:
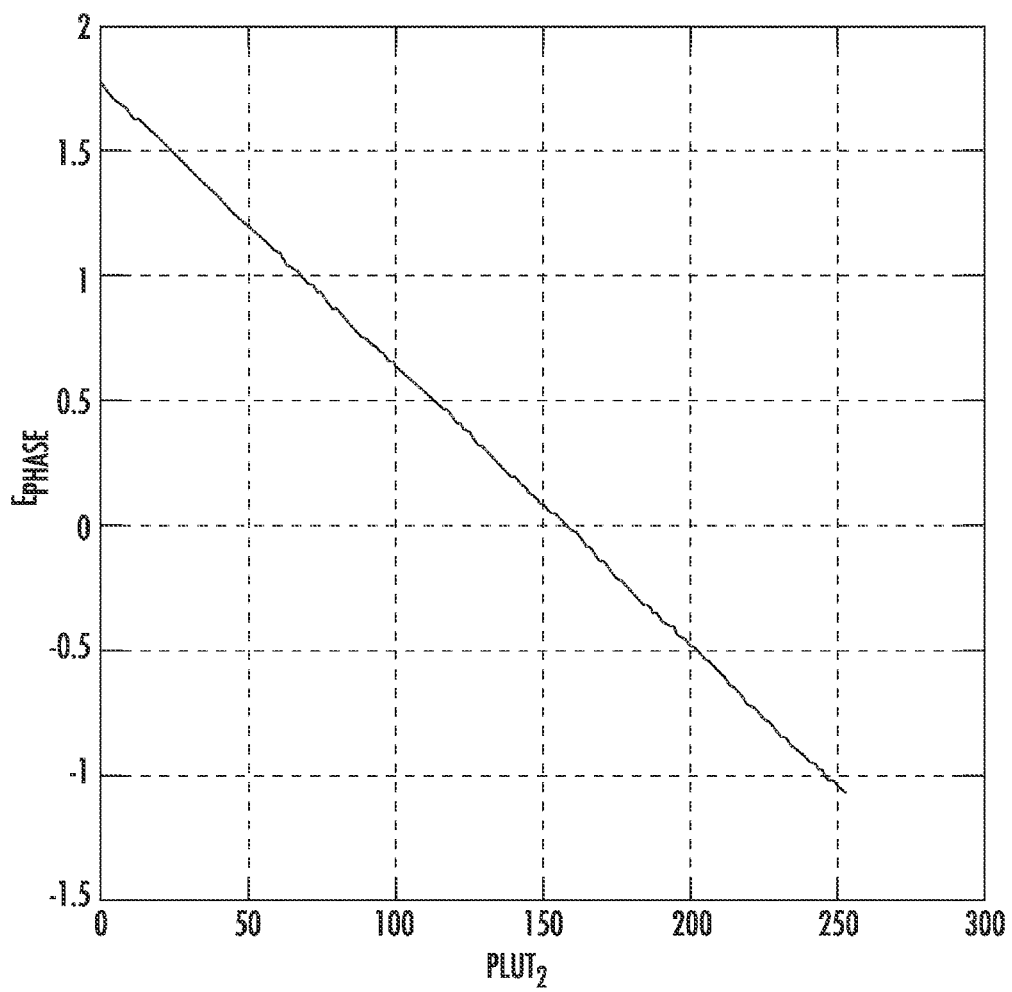
FIG. 16 is a plot of variation of $e_{phase}$ with the address of $PLUT_2$.

Again, the DSP 60 sets the address of PLUT$_1$ 34 such that the output from PLUT$_1$ 34 is zero. In other words, there is no correction performed on ADC$_1$ 20. One embodiment employs a linear distribution of values in the PLUTs 34, 35, where the size of each PLUT 34, 35 be $N_{phase}$. As an example FIG. 16 shows the variation of $e_{phase}$ with the address of PLUT$_2$ 35 based on Eq. (22) with $N_{phase}$=256, although $N_{phase}$ can take any suitable value. As is evident from FIG. 16, the region of zero crossing of $e_{phase}$ corresponds to the optimal address of PLUT$_2$. In FIG. 16, the minimum absolute value of $e_{phase}$ corresponds to PLUT$_2$ address of 157. We now develop an adaptive algorithm that seeks the optimal address of PLUT$_2$ 35 that corresponds to the zero crossing value of $e_{phase}$.

Algorithm for Phase Error Correction

Figure 17:
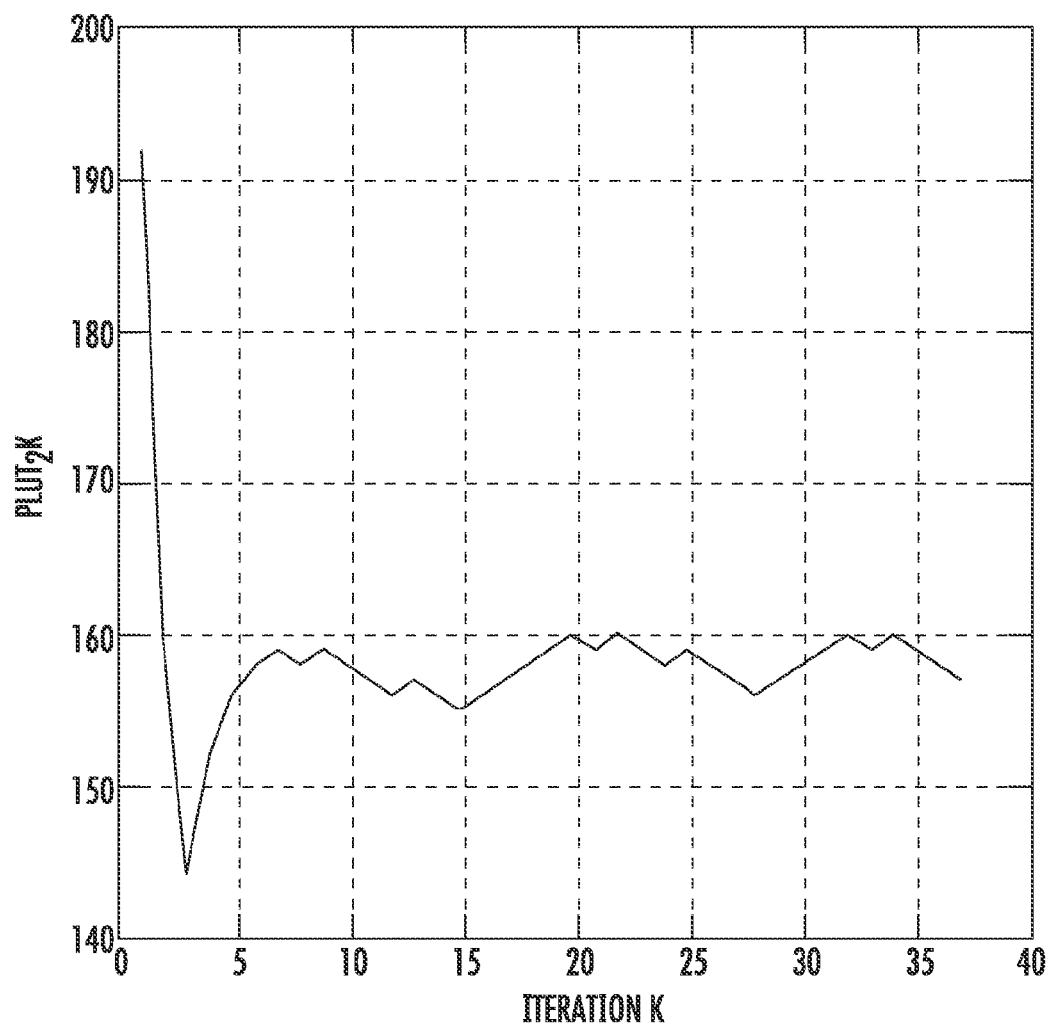
FIG. 17 is a plot of variation of address of $PLUT_2^k$ with iteration k.

Assuming a linear distribution in the PLUTs 34 and 35, the DSP 60 sets the address of PLUT$_1$ 34 to $N_{phase}/2$. Let PLUT$_2^k$ denote the address of PLUT$_2$ 35 at the kth iteration. Let $\mu_3^k$ denote a variable at the kth iteration, and let $\mu_{phase}^k$ denote a step size for the adaptive algorithm at the kth iteration. Here, we assume $$\mu_{phase}^k \in [\mu_{phasemin}, \mu_{phasemax}] \quad (23)$$

where $\mu_{phasemin}$ and $\mu_{phasemax}$ are the minimum and maximum values, respectively, of $\mu_{phase}^k$. The adaptive algorithm for correcting the phase error can be written as $$PLUT_2^k = \frac{N_{phase}}{2} + \text{round}(\mu_3^k) \quad (24)$$

$$\mu_3^{k+1} = \mu_3^k + \text{sign}(e_{phase}) \mu_{phase}^k$$

$$\mu_{phase}^{k+1} = \max\left(\frac{\mu_{phase}^k}{2}, \mu_{phasemin}\right) \text{if } k = k_3$$

where $\mu_3^1 = 0$, $\mu_{phase}^1 = \mu_{phasemax}$ and $k_3$ is any arbitrary positive number. As can be seen from the above adaptive algorithm, $\mu_3^k$ provides the update of the address of PLUT$_2$ 35 based on the sign of $e_{phase}$. At convergence, PLUT$_2^k$ indicates the optimal address of PLUT$_2$ 35 that produces the minimum absolute value of $e_{phase}$. FIG. 17 shows the convergence of PLUT$_2^k$ with iteration k, assuming $N_{phase}=256$. As can be seen from FIG. 17, in about 7 iterations, the PLUT$_2^k$ converges to an address around 157, which is the optimum address corresponding to the zero crossing value of $e_{phase}$ shown in FIG. 16.

It must be noted that it is not necessary to fix the address of PLUT$_1$ 34 at $N_{phase}/2$. If, during an iteration k in the adaptation for phase correction, the address of PLUT$_2$ 35 exceeds the boundaries $[N_1^P, N_2^P]$, where $N_1^P \geq 1$ and $N_2^P \leq N_{phase}$, for example, the address of PLUT$_1$ 34 can be appropriately changed and the adaptation restarted.

It must be also mentioned that Eqn. (22) is valid for all odd Nyquist zones. For even Nyquist zones, the sign of the phase error is the negative of the phase error given in Eqn. (22). In other words, for even Nyquist zones, the phase error becomes $$e_{phase} = \frac{1}{N} \sum_{k=0}^{N-1} \{y_2(n-k) - y_1(n+1-k)\}^2 - \{y_1(n-k) - y_2(n-k)\}^2. \quad (25)$$

Offset, Gain, and Phase Error Correction for Wideband Signals

Figure 18:
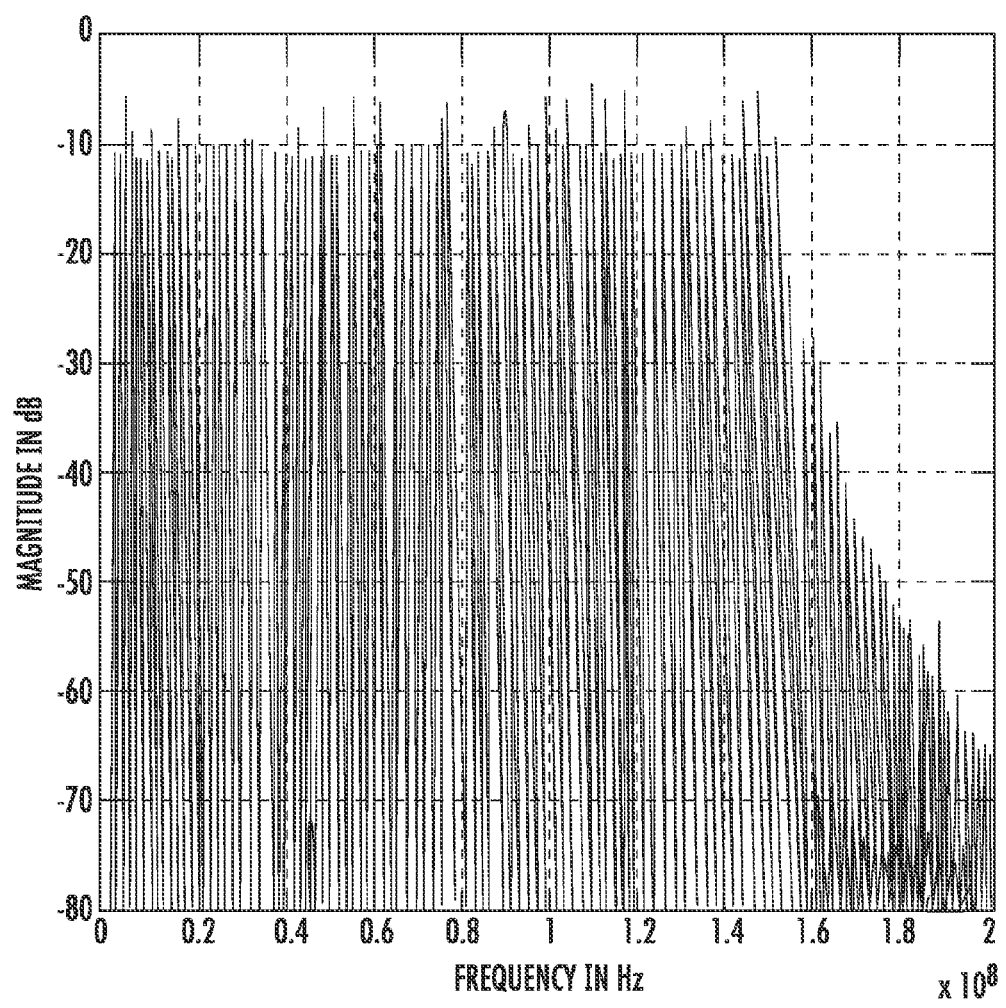
FIG. 18 is a plot of the spectrum of a wideband signal input to the two-channel TIADC.
Figure 19:
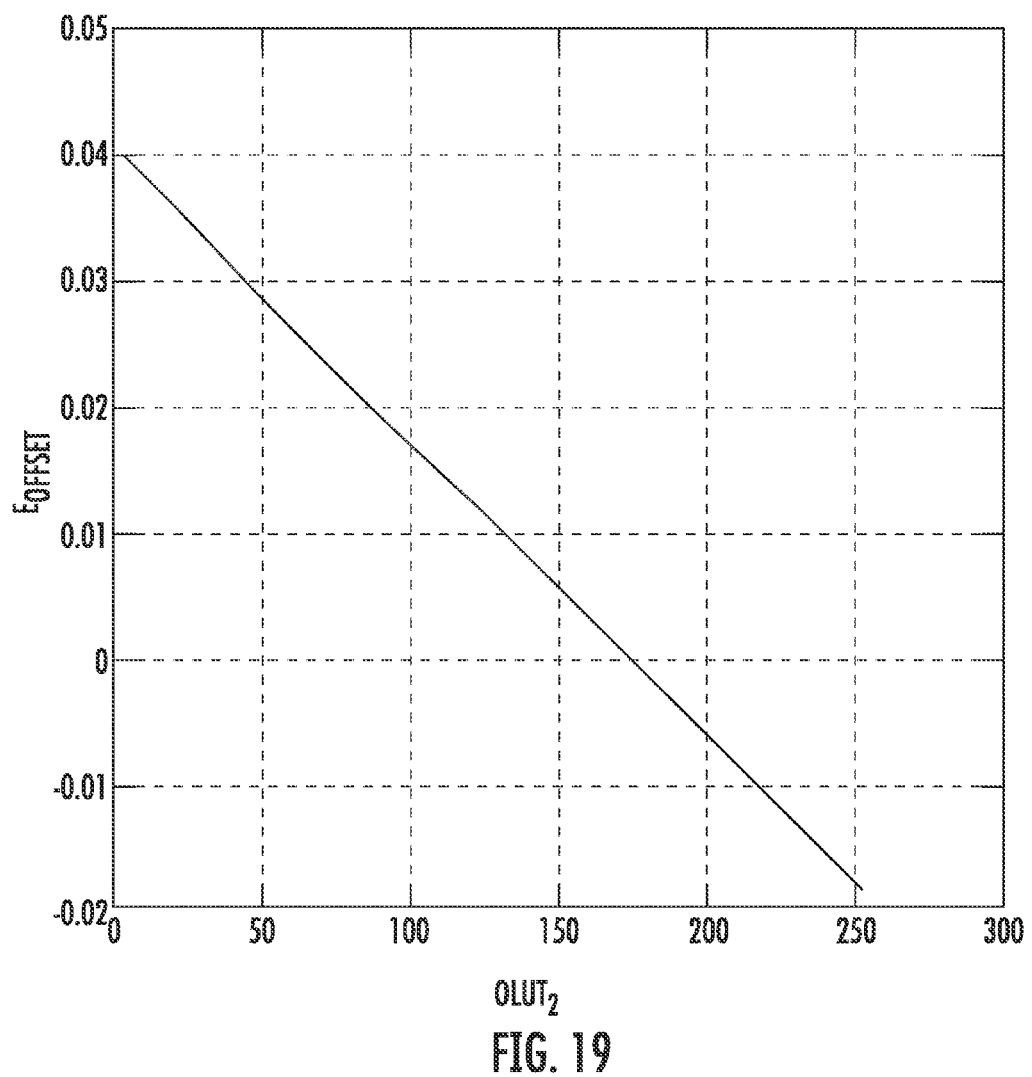
FIG. 19 is a plot of variation of $e_{offset}$ with $OLUT_2$ address for the wideband signal of FIG. 18.

So far we have dealt with the input signal comprising of a single tone. We will now look at the offset, gain, and phase error when the signal is wideband. FIG. 18 shows the spectrum of a wideband signal to a two-channel TIADC 10 with a sample rate of 400 MHz. Again, for a linear distribution of values in OLUT$_2$ 31 with $N_{offset}=256$, FIG. 19 shows the variation of $e_{offset}$ with the address of OLUT$_2$ 31. It is evident from FIG. 19 that $e_{offset}$ is a linear variation between the two extremities of the offset errors, even when the input signal is wideband. It can be seen that the error function passes through zero at a certain address of OLUT$_2$ 31. In view of this, the same algorithm with a binary search for the optimal address of OLUT$_2$ 31 can be used for the case when the input signal is wideband.

Figure 20:
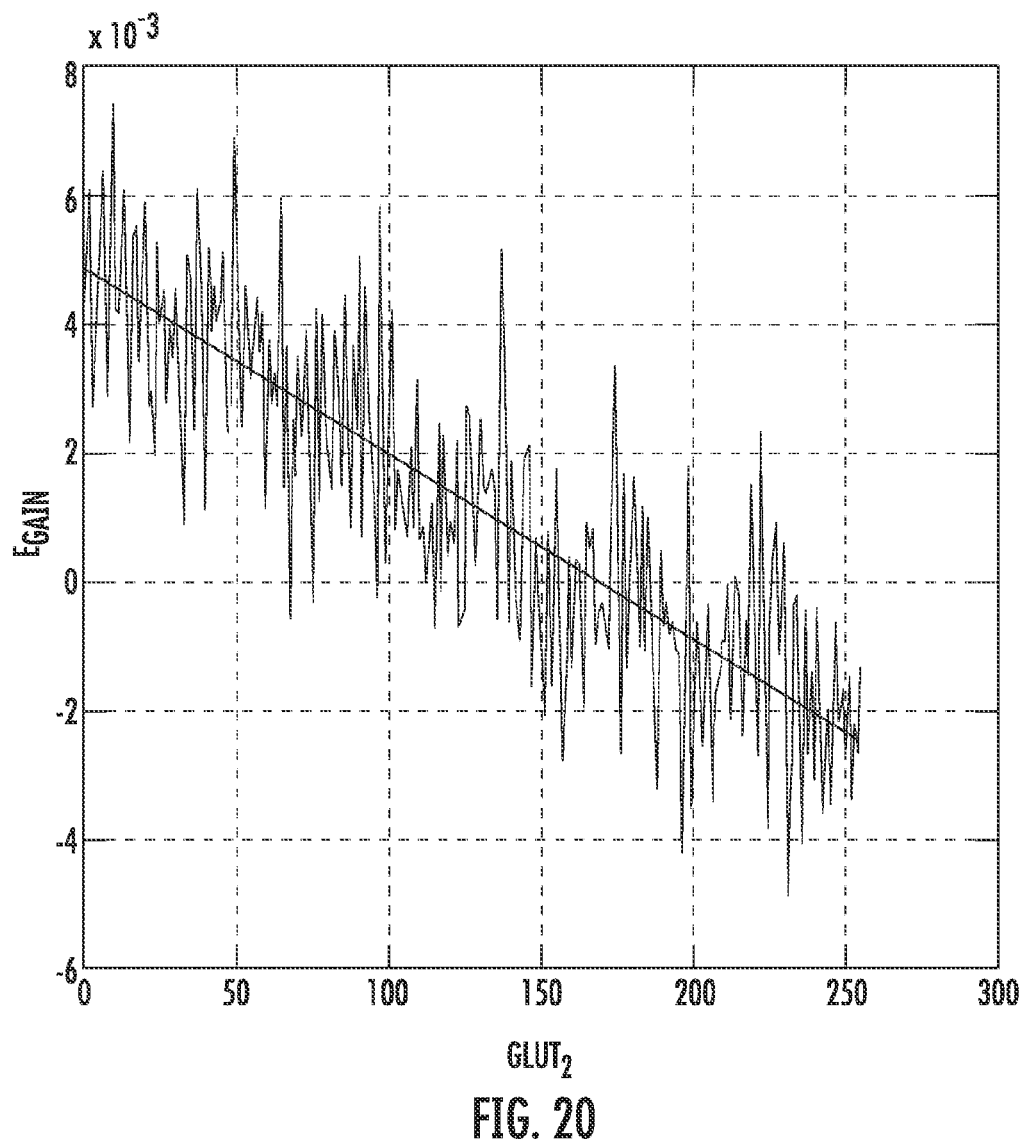
FIG. 20 is a plot of variation of $e_{gain}$ with $GLUT_2$ address for the wideband signal of FIG. 18.

Again, for a linear distribution of values in GLUT$_2$ 33 with $N_{gain}=256$, FIG. 20 shows the variation of $e_{gain}$ with the address of GLUT$_2$ 33. It can be seen from FIG. 20 that the gain error function is no longer a smooth straight line. The gain error, in fact, shows nonlinear behavior. However, upon a careful look at FIG. 20 it can be seen that $e_{gain}$ has a certain trend across the entire range of GLUT$_2$ addresses. By performing a detrending operation on the variation of $e_{gain}$, a linear part can be extracted. In certain embodiments, the detrending operation is preferably a first-order, or linear, least-squares fit to the data, as shown in FIG. 20. This straight line, extracted from the detrending operation, is shown in FIG. 20. This shows that there exists a zero of $e_{gain}$ for a certain address of GLUT$_2$ 33. The adaptive algorithm presented earlier for the gain error estimation and correction can be applied to the case when the input is wideband provided that $\mu_{gainmin}$, $\mu_{gainmax}$, and $k_2$ are chosen appropriately. In order for the algorithm to converge, $\mu_{gainmax}$ and $\mu_{gainmin}$ have to be small so that a linear trend in FIG. 20 can be captured. It must be mentioned that due to small values of $\mu_{gain}^k \in [\mu_{gainmax}, \mu_{gainmin}]$ in the adaptive algorithm, the convergence time becomes longer.

Figure 21:
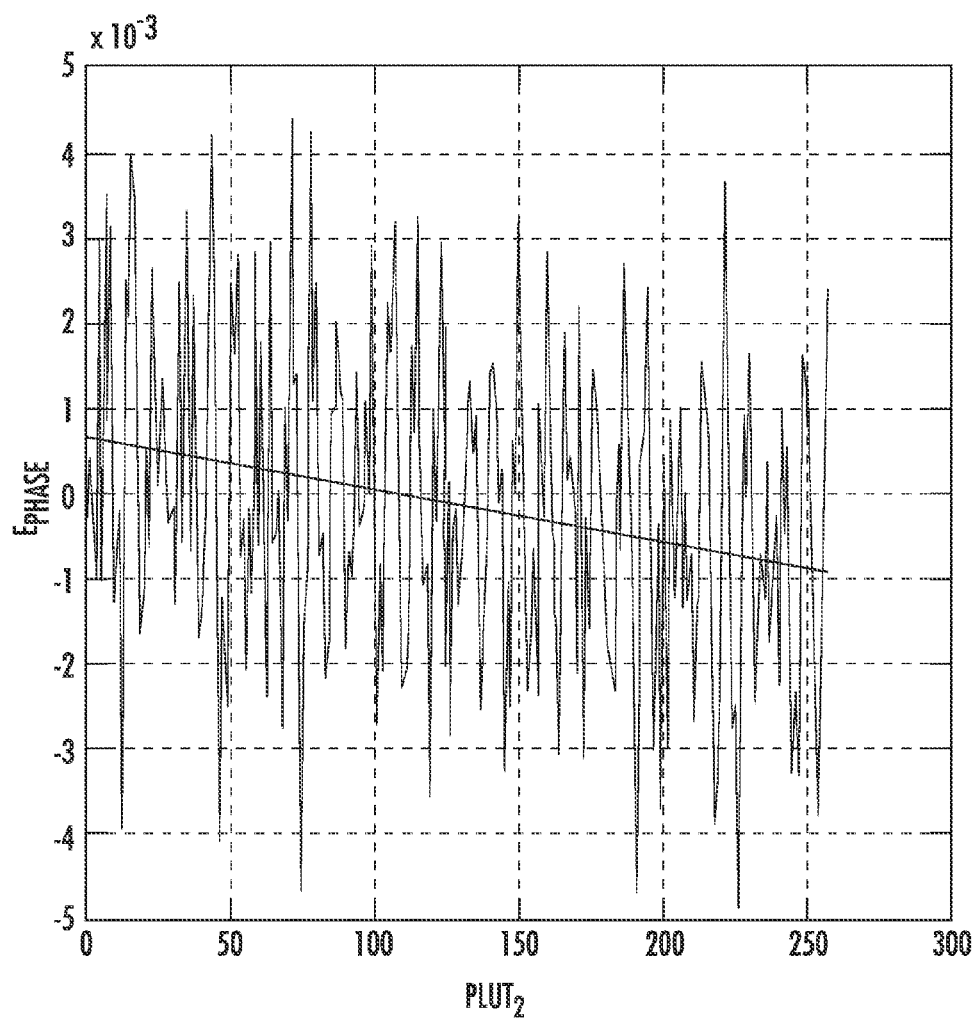
FIG. 21 is a plot of variation of $e_{phase}$ with $PLUT_2$ address for the wideband signal of FIG. 18.
Figure 6:
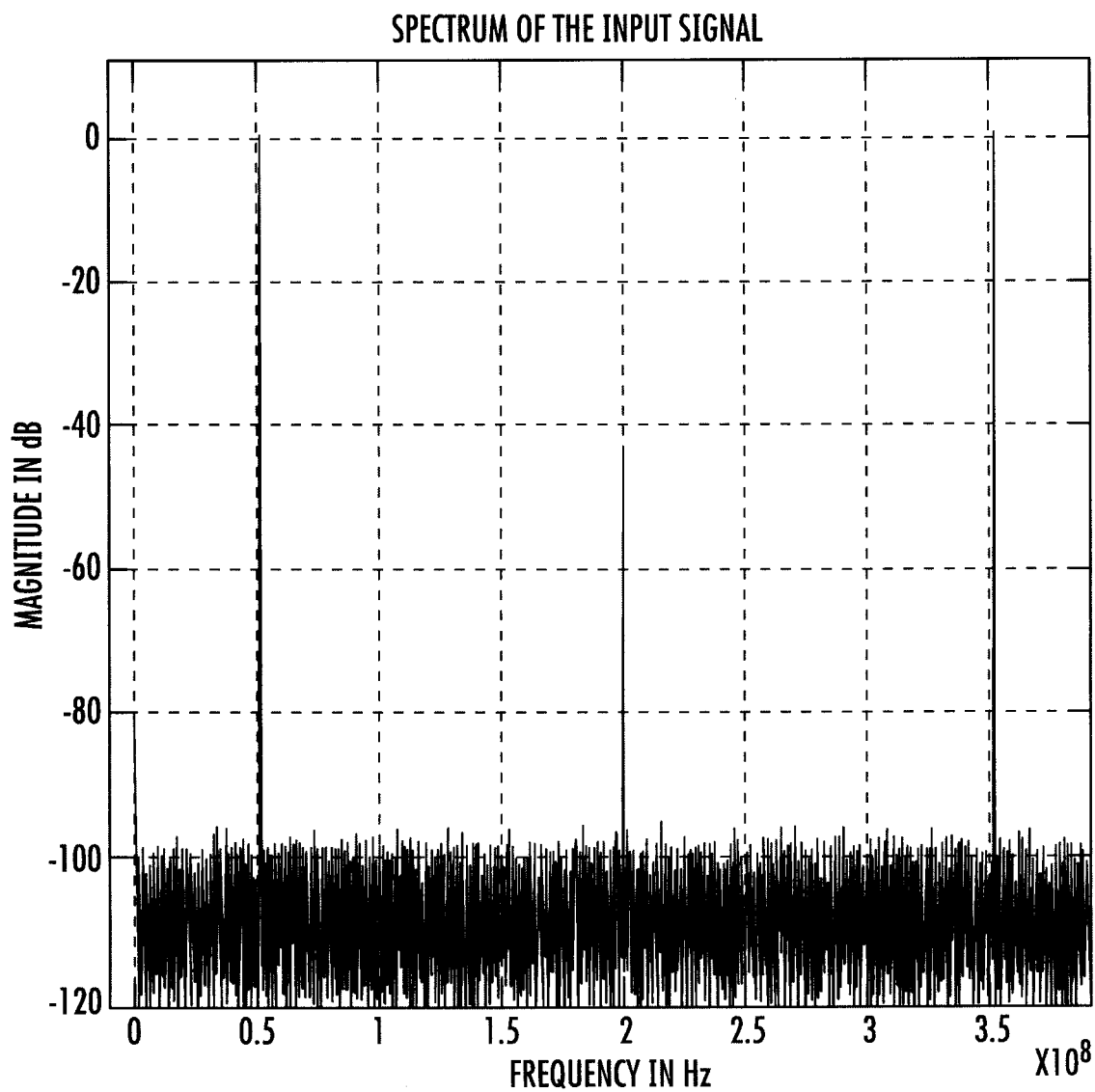
Figure 7:
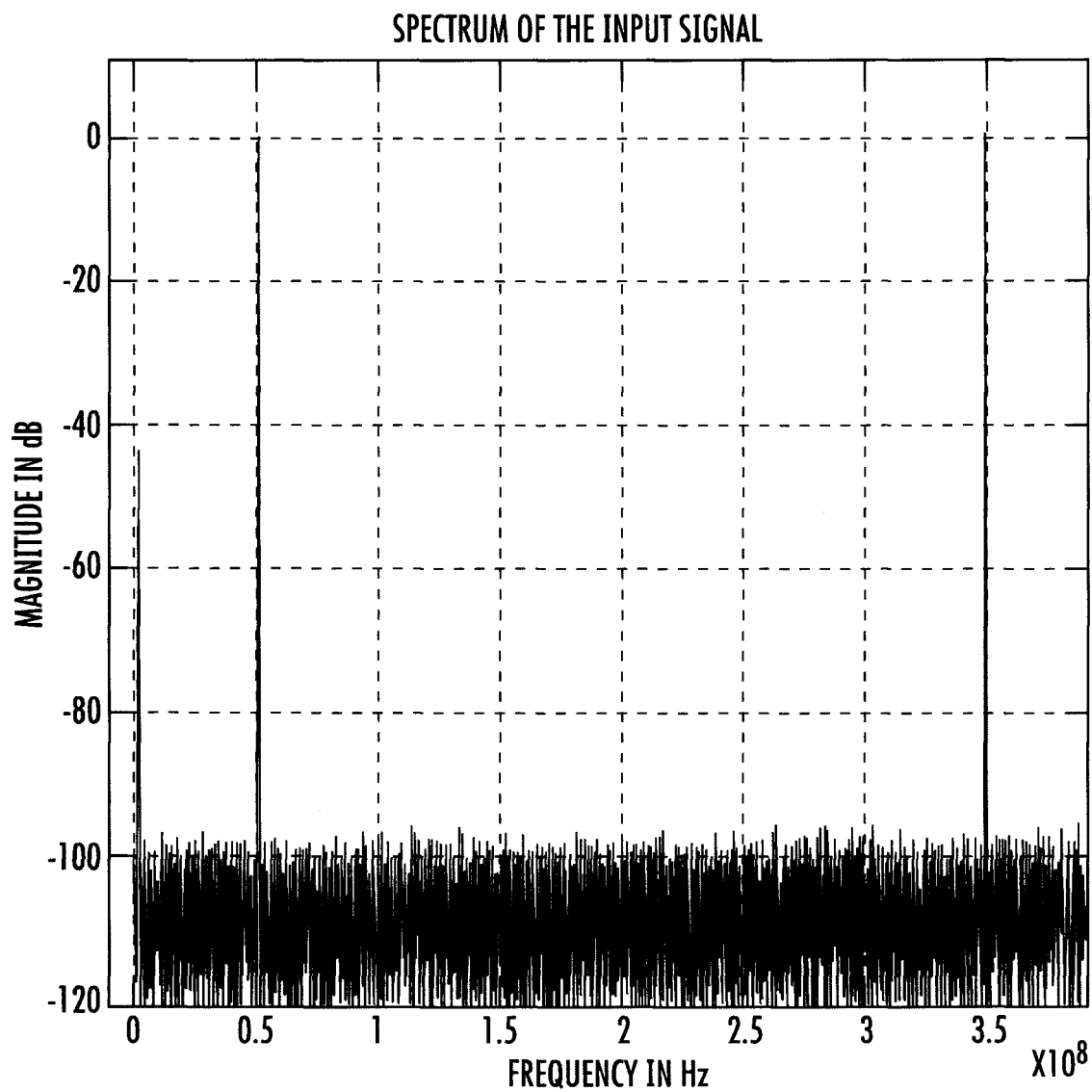
Figure 10:
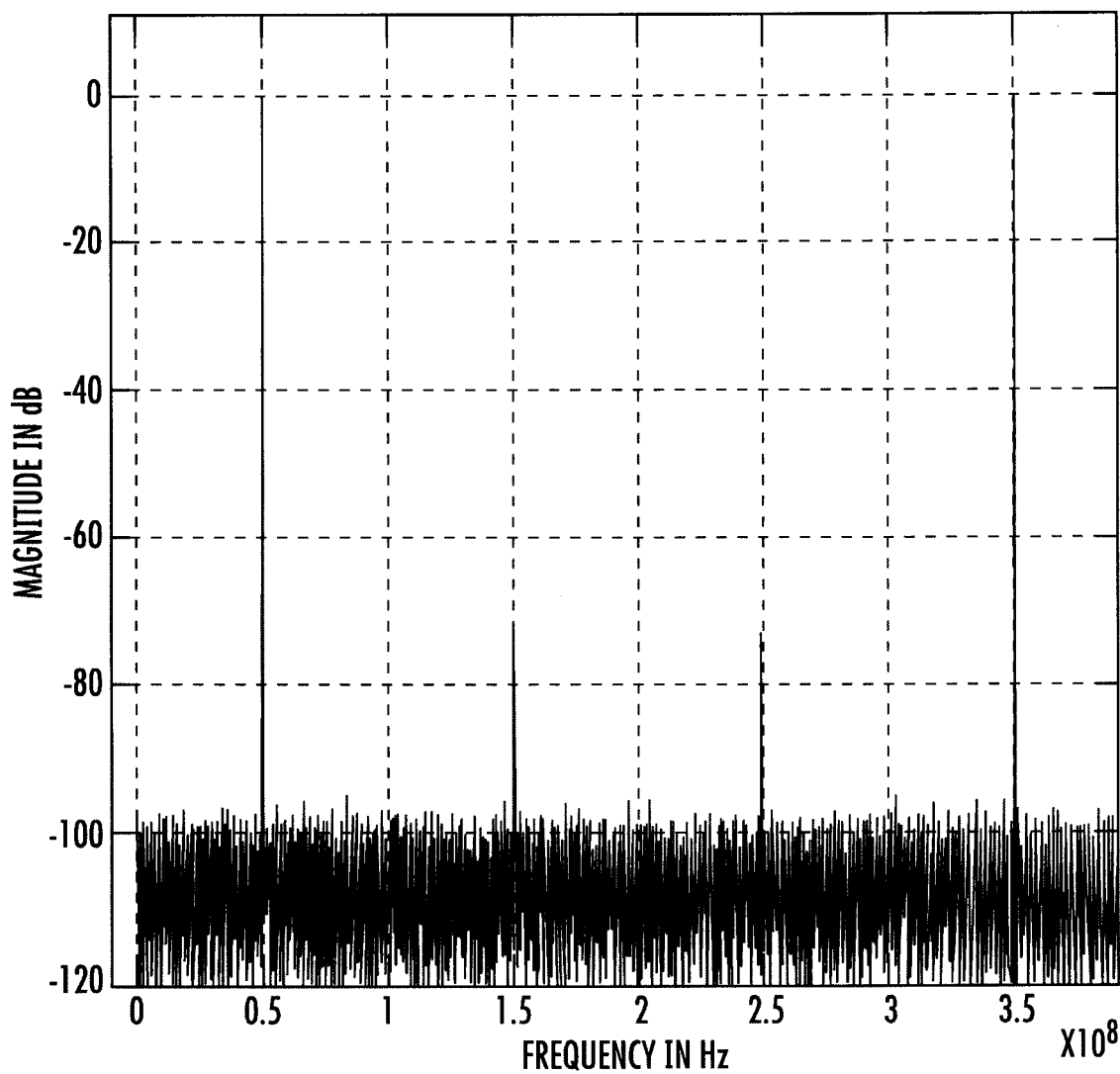
Figure 11:
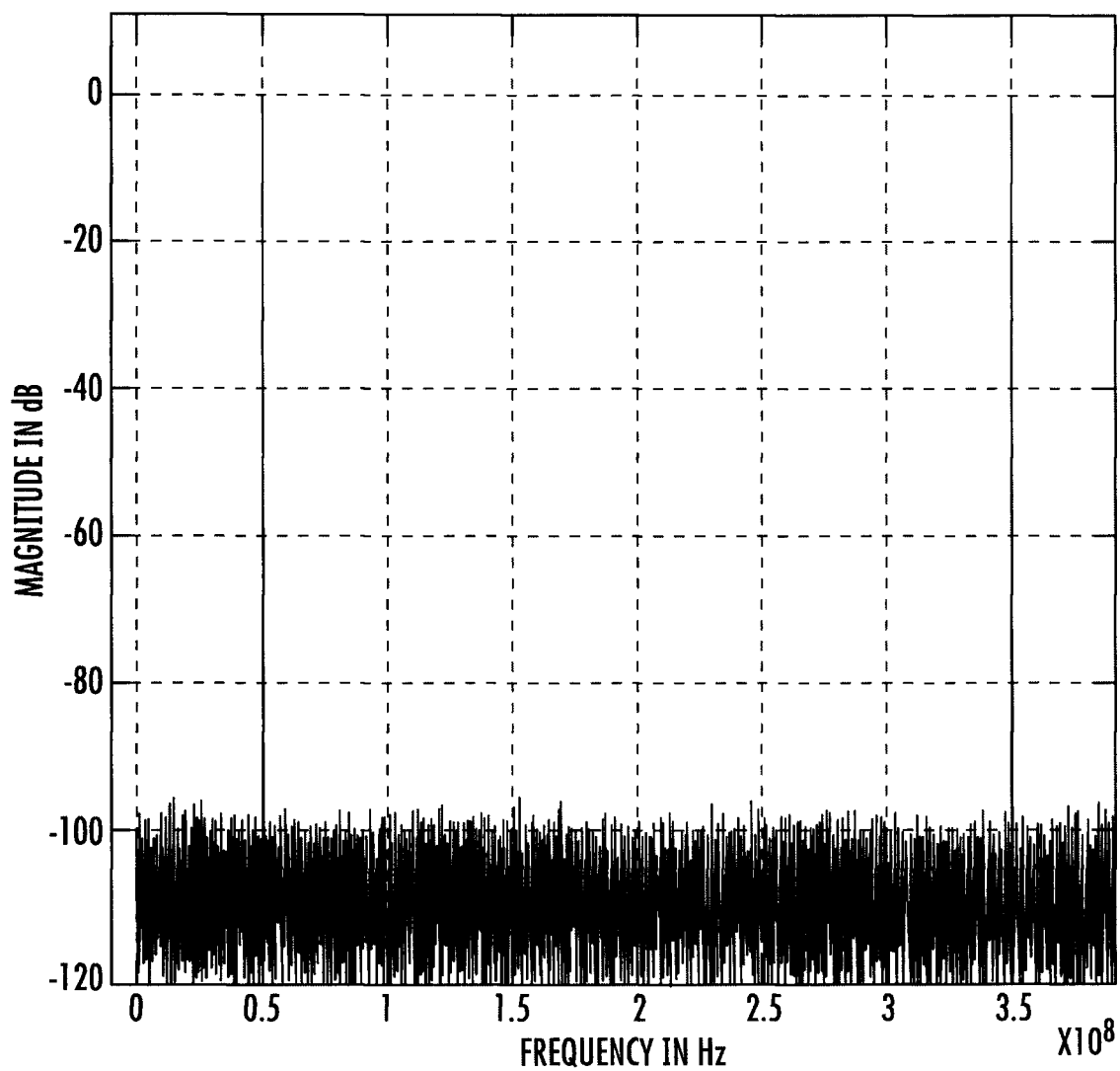
Figure 14:
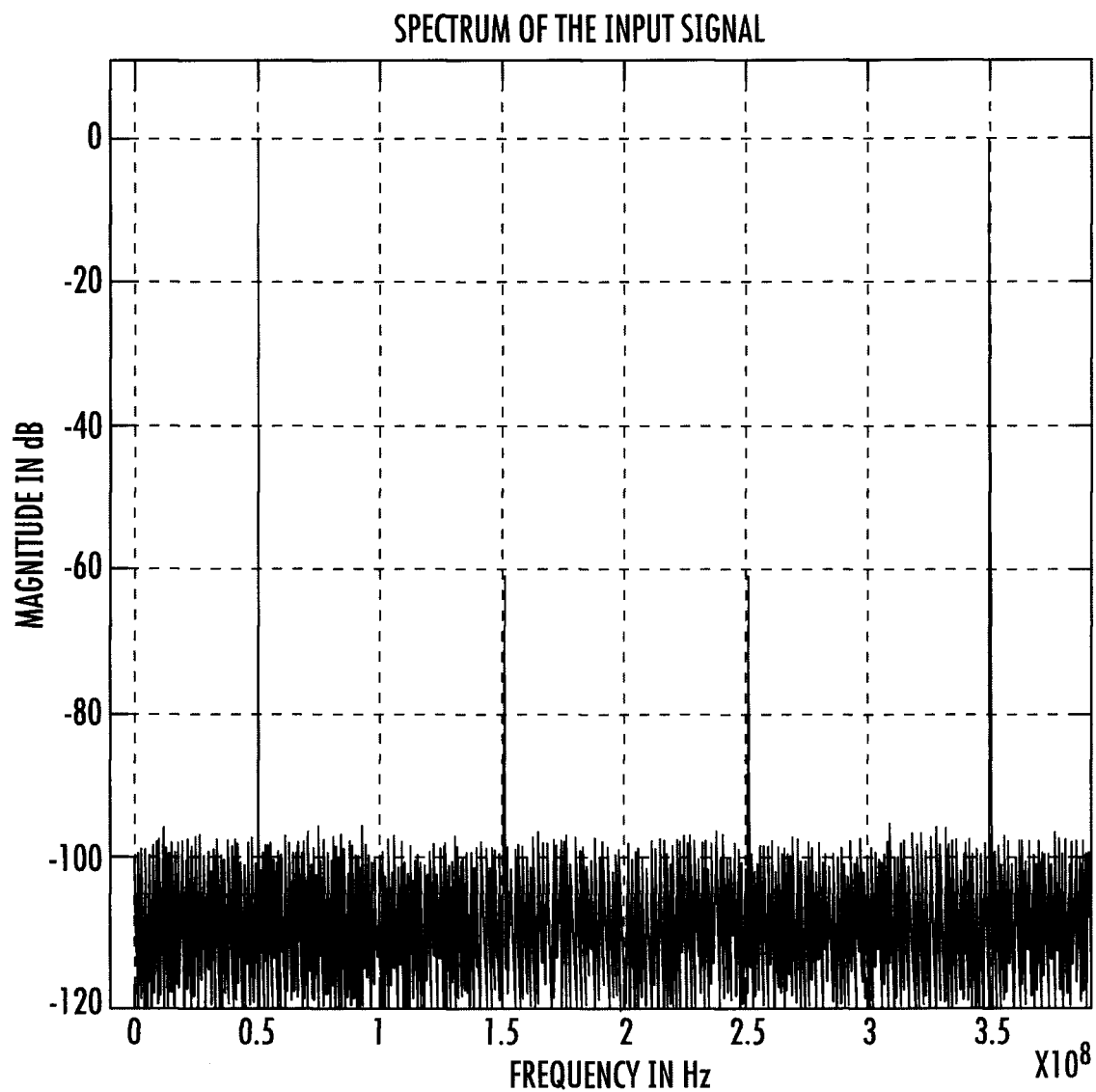
Figure 15:
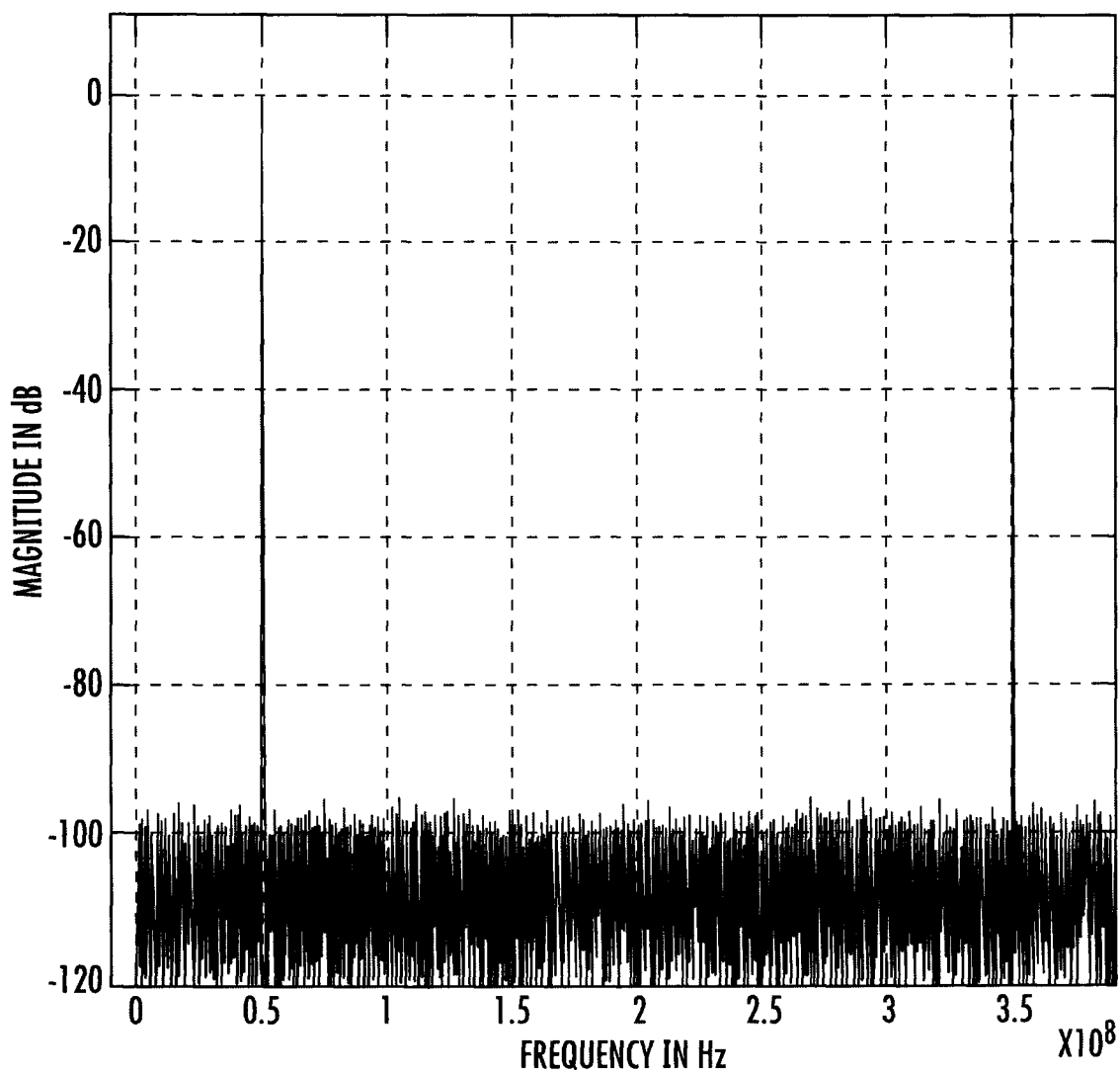

Again, for a linear distribution of values in PLUT$_2$ with $N_{phase}=256$, FIG. 21 shows the variation of $e_{phase}$ with the address of PLUT$_2$. It can be seen from FIG. 21 that the phase error function, just like the gain error function, is no longer a smooth function, but shows nonlinear behavior similar to that of the gain error variation. It can again be seen that $e_{phase}$ has a trend similar to $e_{gain}$ when the input to the two-channel TIADC 10 is wideband. As can be seen from FIG. 21, there is a linear part in the nonlinear variation. Again, by performing a detrending operation on the variation of $e_{phase}$, a linear part can be extracted. Such a straight line, obtained through detrending operation, is shown in FIG. 21. This shows that a zero of $e_{phase}$ exists for a certain address of PLUT$_2$ 35. The adaptive algorithm presented earlier for the phase error estimation and correction can very well be used for the case when the input is wideband provided that $\mu_{phasemin}$, $\mu_{phasemax}$, and $k_3$ are chosen appropriately. In order for the algorithm to converge, $\mu_{phasemax}$ and $\mu_{phasemin}$ have to be small so that a linear trend in FIG. 21 can be captured. Again, it must be mentioned that due to small values of $\mu_{phase}^k \in [\mu_{phasemax}, \mu_{phasemin}]$ in the adaptive algorithm, the convergence time becomes longer.

In many applications, long convergence time may not be acceptable. As seen above, the adaptive algorithm for offset correction can be made to converge within the first 7-8 iterations using a binary search. However, for a wideband input, the errors for gain and phase are nonlinear and hence in order to expedite the convergence, we propose a two-step algorithm wherein the neighborhood of the optimal address of $GLUT_2$ 33 or $PLUT_2$ 35 is obtained in the first step. The second step is the adaptive algorithm mentioned earlier where a small value for $\mu_{gain}^k$ or $\mu_{phase}^k$ is used.

As can be seen from FIGS. 20 and 21, a straight line that represents a least-squares fit for the $e_{gain}$ or $e_{phase}$ variation provides a zero crossing which is the optimal address of $GLUT_2$ 33 or $PLUT_2$ 35, respectively. Towards this end, let $N_{lut}$ denote either $N_{gain}$ or $N_{phase}$, $e_{err}$ denote either $e_{gain}$ or $e_{phase}$ and $X(k)$ denote kth address of $GLUT_2$ 33 or $PLUT_2$ 35. Let $$R = \sum_{k=0}^{N_{lut}} [e_{err}(k) - Y(k)]^2 \qquad (26)$$

$$= \sum_{k=0}^{N_{lut}} [e_{err}(k) - (a + bX(k))]^2$$

where a and b are constants and $e_{err}(k)$ represents the error value for an address location $X(k)$. It must be recalled that $e_{err}(k)$ is obtained using Eqn. (13) or Eqn. (22). It can be noted from Equation 26 that $Y(k)=a+bX(k)$ provides a straight line fit to the variation of $e_{err}(k)$, provided the constants a and b are known. Equating the derivative of R, with respect to the constants a and b, to zero, we get $$\frac{\partial R}{\partial a} = -2 \sum_{k=0}^{N_{lut}} [e_{err}(k) - (a + bX(k))] = 0 \qquad (27)$$

$$\frac{\partial R}{\partial b} = -2 \sum_{k=0}^{N_{lut}} [e_{err}(k) - (a + bX(k))]X(k) = 0$$

By solving the above two equations we get $$a = \frac{\sum_{k=1}^{N_{lut}} e_{err}(k) \sum_{k=1}^{N_{lut}} X(k)^2 - \sum_{k=1}^{N_{lut}} X(k) \sum_{k=1}^{N_{lut}} X(k)e_{err}(k)}{N_{lut} \sum_{k=1}^{N_{lut}} X(k)^2 - \left(\sum_{k=1}^{N_{lut}} X(k)\right)^2} \qquad (28)$$

$$b = \frac{N_{lut} \sum_{k=1}^{N_{lut}} X(k)e_{err}(k) - \sum_{k=1}^{N_{lut}} X(k) \sum_{k=1}^{N_{lut}} e_{err}(k)}{N_{lut} \sum_{k=1}^{N_{lut}} X(k)^2 - \left(\sum_{k=1}^{N_{lut}} X(k)\right)^2}$$

The neighborhood of the optimal point can be obtained by equating $y(k)=0$. Therefore $$k = \text{Int}\left(-\frac{a}{b}\right) \qquad (29)$$

$$= \text{Int}\left(\frac{\sum_{k=1}^{N_{lut}} X(k) \sum_{k=1}^{N_{lut}} X(k)e_{err}(k) - \sum_{k=1}^{N_{lut}} e_{err}(k) \sum_{k=1}^{N_{lut}} X(k)^2}{N_{lut} \sum_{k=1}^{N_{lut}} X(k)e_{err}(k) - \sum_{k=1}^{N_{lut}} X(k) \sum_{k=1}^{N_{lut}} e_{err}(k)}\right)$$

where Int(x) represents the integer part of x. There is no need to calculate $\Sigma_{k=1}^{N_{lut}} X(k)$ and $\Sigma_{k=1}^{N_{lut}} X(k)^2$ since they are known a priori. Using the value of $X(k)$ obtained in the above equation, we set the initial value of $\mu_2^k$ or $\mu_3^k$ equal to $X(k) - N_{lut}/2$. This constitutes the first step of the two-step algorithm. In the second step, we run the adaptive algorithm as mentioned above with appropriate values of $\mu_{gainmin}$ and $\mu_{gainmax}$ for gain or $\mu_{phasemin}$ and $\mu_{phasemax}$ for phase.

In applications where the single-step algorithm is preferred (i.e., applications where slow convergence times are acceptable), we can obtain the initial estimate with a calibration signal that comprises of a single tone input to the two-channel TIADC 10. The algorithm mentioned in this document can be used to obtain convergence. After the convergence with a single tone is obtained, the actual input can be introduced. With an appropriately chosen $\mu_{gainmin}$ and $\mu_{gainmax}$ for gain or $\mu_{phasemin}$ and $\mu_{phasemax}$ for phase, the adaptive algorithm can be restarted.

While this invention has been particularly shown and described with references to example embodiments thereof, it will be understood by those skilled in the art that various changes in form and details may be made therein without departing from the scope of the invention encompassed by the appended claims.

What is claimed is:

1. A two-channel, time-interleaved analog to digital converter (ADC) system comprising:
    a clock signal generator, for generating a clock signal at a frequency f and a period T;
    a first ADC coupled to the clock signal generator, the first ADC sampling and holding an input signal on odd cycles of the clock signal to provide a first digital signal;
    a second ADC coupled to the clock signal generator, the second ADC sampling and holding the input signal on even cycles of the clock signal to provide a second digital signal;
    an error measurement block coupled to receive the first and second digital signals, the error measurement block producing an error signal based on the first and second digital signals;
    an adaptive processor coupled to receive the error signal, the adaptive processor estimating at least one of offset, gain, and sample-time errors between the first and second ADCs based on the error signal, the adaptive processor feeding back a correction signal corresponding to the estimated error to correct one of offset, gain, and sample-time error of at least one of the first and second ADCs; and
    a multiplexer, for interleaving the first and second digital signals to form a digital representation of the input signal.

2. The system of claim 1 wherein the first ADC and second ADC are charge-domain pipelined ADCs, and the correction signal is fed back via an input stage of a charge-domain pipeline.

3. The system of claim 1 wherein the adaptive processor estimates offset error by measuring an error signal based on an intereference tone that depends upon a difference in an amplitude offset between the first and second ADCs.

4. The system of claim 1 wherein the adaptive processor estimates gain error by measuring an error signal based on a difference in power of the first and second digital signals.

5. The system of claim 1 wherein the adaptive processor estimates sample-time error by determining a correlation between the first and second digital signals.

6. The system of claim 1 wherein the adaptive processor sequentially processes offset, gain, and sample-time errors.

7. The system of claim 6 further including plural look-up tables (LUTs) coupled to the adaptive processor, where the correction signal is based on addresses of the LUTs, and each LUT contains values used to control one of an offset setting, gain setting, or delay setting of at least one of the first and second ADCs.

8. The system of claim 6 further including plural digital-to-analog converters (DACs), where the correction signal is provided to the DACs, and each DAC controls one of an offset setting, gain setting, or delay setting of at least one of the first and second ADCs.

9. The system of claim 1, further including additional adaptive processors, the adaptive processors configured to process offset, gain, and sample-time errors in parallel.

10. The system of claim 1 wherein the adaptive processor includes:
    a signum block for determining a sign of the error signal;
    a multiplier for multiplying the sign of the error signal with an address step size;
    a feedback loop for summing and delaying an output of the multiplier; and
    a rounding block for rounding an output of the feedback loop.

11. The system of claim 10 wherein the error measurement block includes:
    a subtractor for taking a difference of the first and second digital signals; and
    a feedback loop for summing and delaying an output of the subtractor to provide the error signal.

12. The system of claim 10 wherein the error measurement block includes:
    a first multiplier for squaring the first digital signal;
    a second multiplier for squaring the second digital signal;
    a subtractor for taking the difference of outputs from the first and second multipliers; and
    a feedback loop for summing and delaying an output of the subtractor to provide the error signal.

13. The system of claim 10 wherein the error measurement block includes:
    a first subtractor for taking a difference of the first and second digital signals;
    a delay element for delaying the first digital signal;
    a second subtractor for taking a difference of the second digital signal and an output from the delay element;
    a first multiplier for squaring an output from the first subtractor;
    a second multiplier for squaring an output from the second subtractor;
    a third subtractor for taking a difference of outputs from the first and second multipliers; and
    a feedback loop for summing and delaying an output of the third subtractor to provide the error signal.

14. The system of claim 1 wherein the adaptive processor estimates and corrects errors using hardware.

15. The system of claim 1 wherein the adaptive processor estimates and corrects errors using software.

16. The system of claim 1 further including plural look-up tables (LUTs), each LUT coupled to the adaptive processor and configured to provide the correction signal to the second ADC for one of offset, gain, or sample-time error based on output from the adaptive processor.

17. A method for correcting errors in a two-channel, time-interleaved analog to digital converter (ADC) comprising:
    generating a clock signal at a frequency f and a period T with a clock signal generator;
    sampling and holding an input signal with first and second ADCs at alternating sample time intervals 2T to produce first and second digital signals, respectively;
    determining an error signal based on the first and second digital signals with an error measurement block;
    estimating at least one of offset, gain, and sample-time error between the first and second ADCs based on the error signal with an adaptive processor;
    providing a correction signal based on the error estimated by the adaptive processor;
    applying the correction signal to at least one of the first and second ADCs to correct one of offset, gain, and sample-time error; and
    interleaving the first and second digital signals with a multiplexer to form a digital representation of the input signal.

18. The method of claim 17 wherein the first and second ADCs are charge-domain pipelined ADCs and the correction signal is applied to an input stage of a charge-domain pipeline.

19. The method of claim 17 wherein estimating offset error includes measuring an error signal based on an intereference tone whose amplitude depends upon a difference in amplitude offset between the first and second ADCs.

20. The method of claim 17 wherein estimating gain error includes measuring an error signal based on a difference in power of the first and second digital signals.

21. The method of claim 17 wherein estimating sample-time error includes determining a correlation between the first and second digital signals.

22. The method of claim 17 wherein offset, gain, and sample-time errors are sequentially estimated and corrected.

23. The method of claim 22 wherein providing the correction signal includes looking up address values corresponding to offset, gain, or sample-time errors in a look-up table.

24. The method of claim 22 wherein providing the correction signal includes converting digital values corresponding to offset, gain, and sample-time errors to corresponding analog offset, gain, and sample-time settings.

25. The method of claim 17, wherein offset, gain, and sample-time errors are estimated in parallel.

26. The method of claim 17 wherein estimating errors includes:
    determining a sign of the error signal with a signum block;
    multiplying the sign of the error signal with an address step size with a multiplier;
    summing and delaying an output of the multiplier with a feedback loop; and
    rounding an output of the feedback loop with a rounding block.

27. The method of claim 26 wherein determining the error signal further includes:

taking a difference of the first and second digital signals with a subtractor; and summing and delaying an output of the subtractor with a feedback loop to provide the error signal.

28. The method of claim 26 wherein determining the error signal further includes:

squaring the first digital signal with a first multiplier;

squaring the second digital signal with a second multiplier;

taking a difference of outputs from the first and second multipliers with a subtractor; and summing and delaying an output of the subtractor with a feedback loop to provide the error signal.

29. The method of claim 26 wherein determining the error signal further includes:

taking a difference of the first and second digital signals with a first subtractor;

delaying the first digital signal with a delay element;

taking a difference of the second digital signal and an output from the delay element;

squaring an output from the first subtractor with a first multiplier;

squaring an output from the second subtractor with a second multiplier;

taking a difference of outputs from the first and second multipliers with a third subtractor; and summing and delaying an output of the third subtractor with a feedback loop to provide the error signal.

30. The method of claim 17 wherein the adaptive processor estimates errors using hardware.

31. The method of claim 17 wherein the adaptive processor estimates errors using software.

32. The method of claim 17 wherein providing the correction signal includes setting an offset, gain, or sample-time setting on the second ADC according to address values corresponding offset, gain, or sample-time errors, respectively, stored on corresponding look-up tables.

33. A two-channel, time-interleaved analog to digital converter (ADC) comprising:

a clock signal generator for generating a clock signal;

a first ADC for receiving the clock signal and sampling and holding an input on odd cycles of the clock signal;

a second ADC for receiving the clock signal and sampling and holding the input on even cycles of the clock signal;

error signal blocks for receiving outputs of the first and second ADCs and providing error signals corresponding to offset, gain, and phase errors of the outputs;

look-up tables (LUTs) for storing values used to control one of an offset setting, gain setting, or delay setting of at least one of the first and second ADCs; and an adaptive processor for receiving the error signals and sequentially estimating the offset, gain, and phase error based on the error signals, the adaptive processor further sequentially providing corresponding corrections of the offset, gain, and phase errors based on the values stored in the LUTs to the first and second ADCs.

* * * * *

UNITED STATES PATENT AND TRADEMARK OFFICE
CERTIFICATE OF CORRECTION

| | | |
|---|---|---|
| PATENT NO. | : 7,839,323 B2 | Page 1 of 7 |
| APPLICATION NO. | : 12/419599 | |
| DATED | : November 23, 2010 | |
| INVENTOR(S) | : Kidambi | |

It is certified that error appears in the above-identified patent and that said Letters Patent is hereby corrected as shown below:

Delete figs. 6, 7, 10, 11, 14, 15 and substitute therefor the drawing sheets, consisting of figs. 6, 7, 10, 11, 14 and 15 as shown on the attached pages.

Signed and Sealed this
Third Day of January, 2012

David J. Kappos
*Director of the United States Patent and Trademark Office*